United States Patent [19]
Takeda et al.

[11] Patent Number: 5,646,526
[45] Date of Patent: Jul. 8, 1997

[54] JOSEPHSON SIGNAL DETECTOR, MEASUREMENT DEVICE USING THE SAME, AND METHOD OF USE

[75] Inventors: Eriko Takeda, Tokyo; Toshikazu Nishino, Kawasaki, both of Japan

[73] Assignee: Hitachi, Ltd., Tokyo, Japan

[21] Appl. No.: 356,495

[22] Filed: Dec. 15, 1994

[30] Foreign Application Priority Data

Dec. 20, 1993 [JP] Japan ................................. 5-319403
Feb. 3, 1994 [JP] Japan ................................. 6-011482

[51] Int. Cl.$^6$ ....................... G01R 33/035; G01R 33/02; H03M 1/12
[52] U.S. Cl. ........................ 324/248; 505/846; 341/133
[58] Field of Search .................... 324/248, 244; 505/845, 846; 341/133, 155

[56] References Cited

U.S. PATENT DOCUMENTS

| | | | |
|---|---|---|---|
| 5,191,236 | 3/1993 | Ruby | 505/854 X |
| 5,248,941 | 9/1993 | Lee et al. | 324/248 |
| 5,305,006 | 4/1994 | Lee | 341/155 |
| 5,351,049 | 9/1994 | Lee et al. | 341/133 |
| 5,396,242 | 3/1995 | Lee | 341/133 |
| 5,420,586 | 5/1995 | Redparvar | 341/133 |

FOREIGN PATENT DOCUMENTS

| | | |
|---|---|---|
| 0435652A3 | 12/1990 | European Pat. Off. . |
| 0441634A2 | 2/1991 | European Pat. Off. . |
| 0448368A3 | 3/1991 | European Pat. Off. . |

OTHER PUBLICATIONS

*Applied Physics Letter*, "Study on the Operation of a Dual Channel Digital Superconducting Quantum Interference Device with Direct–Current–Powered Josephson Multiplexer Readout", vol. 66, No. 12, Mar. 1995, pp. 1548–1550.

Fujitsu–Scientific and Technical Journal, "Josephson Integrated Circuits III A Single–Chip SQUID Magnetometer", vol. 27, No. 1, Apr. 1991, pp. 59–83.

*Cryogenics*, "High Slew Rate Gradiometer Prototype with Digital Feedback Loop of Variable Step Size", vol. 30, No. 4, Apr. 1990, pp. 330–334.

*IEEE Transactions on Magnetics*, "Measured Performance Parameters of Gradiometers with Digital Output", vol. 25, No. 2, Mar. 1989, pp. 1034–1037.

*Cryogenics*, "Digital Feedback Loops for d.c. SQUIDs", vo. 26, No. 11, Nov. 1986, pp. 623–627.

Primary Examiner—Sandra L. O'Shea
Assistant Examiner—Roger Phillips
Attorney, Agent, or Firm—Antonelli, Terry, Stout & Kraus, LLP

[57] ABSTRACT

A Josephson signal detector is presented which includes (1) a sensor with at least one Josephson junction (e.g., a SQUID) and (2) a comparator (e.g., an analog-to-digital converter); a measurement system using such detector; and a method of using such detector and measurement system. The detector can be, e.g., a digital SQUID. The detector can also include a readout circuit for reading out the output of the comparator. In one aspect of the invention, the sensor, or both the sensor and readout circuit, are powered by a DC current source. Through use of the DC current source, it is possible to provide, e.g., a digital SQUID, having reduced crosstalk and reduced fluctuation of ground potential, and which is kept from an increase in noise or a miss operation.

65 Claims, 25 Drawing Sheets

JOSEPHSON SIGNAL DETECTOR, MEASUREMENT DEVICE USING THE SAME, AND METHOD OF USE

BACKGROUND OF THE INVENTION

The present invention relates to a Josephson signal detector having a sensor with at least one Josephson junction, e.g., a digital SQUID (i.e., Superconducting Quantum Interference Device), capable of sensing with a digital output the magnitude of a signal, and a measurement system using the digital SQUID; and, more particularly, to a reduction of noise, an improvement in measurement accuracy and a prevention of miss operation of such Josephson signal detector (digital SQUID).

The present invention also relates to a Josephson signal detector comprising: a sensor constructed to include at least one Josephson junction; and a comparator constructed to include at least one Josephson junction and capable of discriminating the output voltage or output current of said sensor, wherein the Josephson oscillation generated by the Josephson junction of said sensor at the operating time of said sensor is filtered out in further processing of the output of the sensor. More particularly, this aspect of the present invention relates to a Josephson signal detector, which is stabilized in operation and facilitated to improve measurement accuracy, and to a measurement device which is constructed to include the Josephson signal detector.

The SQUID is an element capable of detecting a micromagnetic field by making use of the superconducting property. The SQUID is intrinsically a sensor for inputting an analog magnetic flux signal to output an analog voltage signal, but is used as a sensor for outputting a digital signal to improve the function, as is well known as the "digital SQUID" in the art. Like many other sensor techniques, the digital SQUID can facilitate signal processing and data transmission. Therefore, the digitization per se is not intrinsic to the SQUID, but there have been disclosed several specific methods to provide a digital signal from the SQUID.

One method of realizing the digital SQUID is disclosed in Japanese Patent Laid-Open No. 21379/1989. On the other hand, a method of driving a multi-channel digital SQUID magnetic flux device having a plurality of digital SQUIDs is disclosed in Japanese Patent Laid-Open No. 197885/1991, for example.

FIG. 20 is a circuit diagram showing a digital SQUID in the prior art. In the digital SQUID in the prior art, the sensor or a superconducting quantum interference device is powered by an AC current source 59 so that positive or negative pulses are outputted depending upon the magnitude of the magnetic flux inputted. The magnitude of the magnetic flux to be measured can be determined by counting the number of the positive or negative pulses and by feeding back a current proportional to the difference.

Here will be described the operation of the digital SQUID, with reference to FIG. 20. The signal magnetic flux detected by a pickup coil 700 is inputted by an input coil 220 to the SQUID 485. This SQUID is biased by an AC current source 59 and is composed of two Josephson junctions 110 and an inductance 221. The SQUID feeds back the positive or negative current pulses responding to an input magnetic flux corresponding to the difference between the amount of magnetic flux signal coming from the input coil 220 and the amount of feedback magnetic flux, to the feedback circuit 475 through a switching current 810 which is also powered by the AC current source and composed of an AND gate 801 and OR gates 800. The feedback circuit is composed of a superconducting loop having an inductance 223, two Josephson junctions 111, and a write gate for converting the pulses fed through the switching circuit 810 into a magnetic flux quantum. This write gate is composed of another inductance 222 magnetically coupled to the inductance 223. The pulses having passed through the write gate are converted into a magnetic flux quantum and stored in a superconducting loop composed of an inductance 224.

The inductance 224 is coupled to the inductance 221 of the SQUID through a magnetic coupling 900 (each of reference characters 900 represents a magnetic coupling), and the magnetic flux quantum stored in the superconducting loop containing the inductance 224 is fed back to the SQUID. As a result, the feedback circuit can measure the pulses outputted from the SQUID and can feed back the magnetic flux quantity according to the result to the SQUID. In FIG. 20, reference character 320 is the terminal to the output processing circuit and the display circuit, where appropriate. An output signal 499 is passed to these circuits for further processing and display, respectively.

Another method of realizing a digital SQUID is described in detail on pages 623 to 627 of CRYOGENICS, 1986, Vol. 26, by Drung. Drung has described a method of using a comparator powered by an AC current source in combination with the SQUID.

In a comparator, as constructed to use a Josephson junction, whether the Josephson junction is in the superconducting state or in the normal conducting state corresponds to whether an input signal is present or absent. The comparator itself may be used as a sensor, or a sensor constructed of a Josephson junction may be arranged as a front stage, before the comparator. In case a SQUID is arranged at the front stage, for example, there arises an advantage that the SQUID can have its analog voltage signal converted by the comparator into a digital signal to facilitate the processing of signals and the transfer of data. This is described in detail in the aforementioned article on pages 623–627 of CRYOGENICS, 1986, Vol. 26, by Drung.

A method of combining a SQUID 1 and a comparator 2 is shown in FIG. 35. This comparator 2 is constructed to receive a signal from the SQUID 1 by a magnetic coupling 100', thereby to detect the presence of the input signal. The comparator 2, as disclosed in the prior art, is constructed to include two Josephson junctions 32', a superconducting wiring connecting the Josephson junctions 32' for forming a loop containing an inductance 92', and an AC (alternating current) current source 7'. The Josephson junction 32' has a superconducting critical current of 30 μA and an electrostatic capacity of 0.45 pF, and the inductance 92' has a value of 17 pH. In response to the signal from the SQUID, the comparator changes (or switches) from the superconducting state having a zero voltage to the voltage state having a finite voltage. The signal current, which is determined by a voltage established in the comparator and a load resistor, flows out as the output signal from the comparator.

In the digital SQUID disclosed by Drung, there is no reference to a technique of processing the digital signal outputted from the combination circuit of the SQUID and the comparator. Hence, there is not intrinsically present the technical view necessary for making the digital signal processing and the highly accurate magnetic flux signal detection compatible. In the technique of the digital SQUID, the technique necessary for simultaneously effecting the aforementioned digital signal processing and magnetic flux signal detection is disclosed in the foregoing Japanese Patent Laid-Open No. 21379/1989. In this prior art, the SQUID itself is caused to execute the operation as the comparator by using the AC current source for the SQUID. Thus, it is essential to use an AC current source. Moreover, a Josephson logic circuit to be powered by the AC current source is used for processing the digital signal outputted or for controlling by the feedback. In case the digital SQUID is to be constructed by using either the SQUID powered by the AC current source or the Josephson logic circuit, the circuit has to be fed with an AC current having a high frequency, thus raising the following three kinds of problems.

The first problem is the reflection of radio-frequency waves. It is very difficult to make a complete coincidence between the impedance of the wiring from the current source and the impedance of the SQUID or the Josephson logic circuit. Because of this difficulty, the radio-frequency current fed from the outside is reflected at the wiring portion immediately upstream of the SQUID or the Josephson logic circuit so that the input waveforms are collapsed. This causes a miss operation in the SQUID or the digital logic circuit.

The second problem is crosstalk. Since a radio-frequency current as high as several tens to hundreds mA is fed to the wiring, an induction current is established in another peripheral wiring or in the SQUID itself, by the induction. The crosstalk thus established between the wirings makes a noise. Especially, noise due to the crosstalk established in the SQUID causes deterioration of the measurement accuracy, and the noise transmitted to the measurement circuit system such as the feedback circuit causes a miss operation in the circuit, and, still worse, in the system.

The third problem is the fluctuation of the ground potential. The resultant noise likewise causes deterioration of the measurement accuracy.

Like the SQUID, the Josephson logic circuit for the digital signal processing is powered by an AC current source in the prior art, so that the above-specified problems occur to cause deterioration of measurement accuracy and miss operation of the system.

Thus, in the digital SQUID of the prior art, neither a view point is present, nor is there paid sufficient care, to reduction of the noise for-measuring a weak signal such as the magnetic flux, improvement in measurement accuracy and prevention of miss operation of the system, in the case of the digital operation or in the digital signal processing of the output signal.

Moreover, in prior proposals having its SQUID arranged at the front stage, before the comparator, this comparator directly detects the output voltage, which is generated by the Josephson junction contained in the SQUID, by converting it into an output current through a resistor. FIG. 36 is a diagram schematically illustrating the change in the characteristics in case a magnetic flux signal is inputted to the SQUID. The current-voltage characteristics of the SQUID continuously change from $n\Phi_o$ to $(n+0.5)\Phi_o$, as shown. If, therefore, the bias current of the SQUID is selected, as shown in FIG. 36, the operating voltage range of the SQUID is determined, as shown. In FIG. 36, 500' and 501' respectively represent the operating voltage range and the bias current.

At this time, an AC current due to the AC Josephson effect is superposed on an output current of the SQUID. FIG. 37 illustrates one example of the relation between the magnitude of an input magnetic flux and the current converted from the output voltage of the SQUID by a resistor, in case the input magnetic flux of the SQUID increases in proportion to time. In FIG. 37, a solid curve plots the output current of an actual SQUID on which is superposed an AC current due to the AC Josephson effect. A broken curve plots the current which is converted by a resistor from the output voltage of the SQUID after having been passed through a low-pass filter and which is the output of the SQUID usually observed on an oscilloscope. The frequency of the AC current due to the AC Josephson effect takes a value which is determined by subtracting the output voltage of the SQUID by a magnetic flux quantum $\Phi_o(\frac{2}{10}^{15}\text{Wb})$, and normally ranges from about 100 MHz to about 50 GHz. This AC current has its peak value modulated due to the electrostatic capacitance and the inductance contained in the SQUID by another lower frequency than that of the AC Josephson effect, as indicated by the solid curve of FIG. 37, so that it will not always change monotonously with respect to the output voltage of the SQUID.

The output of the SQUID to be observed by the oscilloscope or the like does not contain the AC current due to such AC Josephson effects. This is partly because the AC current attenuates due to the stray capacitance and the inductance existing in the wiring from the SQUID placed in a cryogenic state, to the oscilloscope placed at room temperature, and partly because the measurement band of the oscilloscope falls short of such high frequency. If, however, a comparator using the Josephson junction is arranged in the vicinity of the SQUID, the AC current due to the AC Josephson effect reaches the comparator without any attenuation. Moreover, the Josephson junction contained in the comparator can be switched at a high speed. If, therefore, the comparator is manufactured without any special consideration, as in prior proposals, it switches in response to the AC current due to the AC Josephson effect.

Thus, in prior proposals in which the SQUID is arranged at the front stage of the comparator, the comparator is constructed without any special consideration of the influences of the AC current due to the AC Josephson effect upon the measurement accuracy and the stability of the operations of the device, and the signal containing the AC current due to the AC Josephson effect is read out by the comparator. In prior proposals, therefore, there is a problem that the value of the output voltage of the SQUID read out by the comparator usually fails to correspond to the output voltage of the SQUID observed by the oscilloscope.

More specifically, the following two points belong to this problem. Firstly, the peak value or waveform of the AC current is not timewise steady but changes. This raises a problem that the output of the SQUID read out by the comparator seriously disperses to deteriorate measurement accuracy.

Moreover, the amplitude of the AC current is not proportional to a DC (direct current) component of the output voltage of the SQUID but may have its magnitude increased, as the case may be, to ten times as high as the DC component of the output voltage of the SQUID. This raises another problem that the linearity between the output of the comparator and the input magnetic flux to the SQUID is deteriorated, to make the measurement itself difficult and to make the circuit operation unstable.

Here has been described the problem in the case in which a SQUID is arranged at the front stage, before the comparator. This problem is common among all the comparators that receive a signal from a sensor composed to a Josephson junction. Thus, in prior proposals neither a view point is present upon, nor is taken a sufficient care of, the drop of measurement accuracy of the comparator or the prevention of the unstable operation of the device, which is caused by the AC current due to the AC Josephson effect.

SUMMARY OF THE INVENTION

A first object of the present invention is to solve the above-specified problems of the prior art and to provide a Josephson signal detector (e.g., a digital SQUID) having a low noise and a high performance, and a measurement system using the digital SQUID.

A second object of the present invention is to solve the above-specified problems of prior proposals and to provide both a Josephson signal detector which has a high measurement accuracy and which is excellent in operation stability, and a measurement device which is constructed to include the Josephson signal detector.

The above-mentioned first object of the present invention can be achieved by a first aspect of the present invention, where a DC (direct current) current source is used to power at least the sensor having at least one Josephson junction, of the Josephson signal detector. More desirably DC current sources are used to power the sensor having at least one Josephson junction (e.g., a SQUID having two Josephson junctions and a superconducting ring arranged to connect the two Josephson junctions) and the readout circuit, of the Josephson signal detector (e.g., digital SQUID). This first aspect of the present invention can be achieved by a measurement system using this Josephson signal detector (digital SQUID), and by a method of using the Josephson signal detector and measurement system wherein the sensor, or both the sensor and readout circuit, are powered by DC current sources. Generally, according to this first aspect of the present invention, a circuit for inputting and outputting an analog signal (e.g., the sensor) and a circuit for inputting and outputting a digital signal (e.g., the readout circuit) are powered by a DC current source.

More specifically, the above-specified first object can be achieved by a digital SQUID comprising: a SQUID including two Josephson junctions and a superconducting ring arranged to connect said two Josephson junctions; a comparator including a Josephson junction for recognizing the magnitude of the output voltage or output current of said SQUID; and a readout circuit including a Josephson junction for reading out the output of said comparator, wherein said SQUID and said readout circuit are powered by a DC current source.

In case the SQUID is powered by a DC current source, its output is generally an analog voltage. In this case, an analog circuit such as a lock-in amplifier to be operated at room temperature is necessary for controlling the SQUID and has a higher heat noise than the SQUID which is operating at liquid helium temperature, to cause reduction of the sensitivity of the SQUID. If, on the contrary, the SQUID has its output digitized, its accessory circuit can be manufactured of a superconducting circuit containing a Josephson junction. As a result, the information processing can be accomplished over a common chip. This makes it unnecessary to use the FLL (i.e., Flux Locked Loop) system which is generally used for feeding back a signal in the analog system. As a result, the band, which is restricted by the magnetic flux modulation frequency of the FLL, can be widened to give a high performance and a high function to the SQUID. These situations are absolutely identical to those of the case in which the SQUID is powered for the digitization by an AC current source or in which the signal processing circuit is driven by the Josephson junction, but avoid the aforementioned problems.

The above-specified second object can be achieved by a second aspect of the present invention, by constructing a Josephson signal detector comprising: a sensor constructed to include at least one Josephson junction, and a comparator constructed to include at least one Josephson junction and capable of discriminating the output voltage or output current of said sensor, wherein the Josephson oscillation generated by the Josephson junction of said sensor at the operating time of said sensor has a higher frequency than that corresponding to the turn-on delay of the Josephson junction of said comparator; a measurement device containing such detector; and a method of using such Josephson signal detector and such measurement device. In such method, capacitance of the comparator (capacitance of the Josephson junction, or combined capacitance of the Josephson junction and additional capacitor (or capacitors) is selected to have the above-described turn-on delay, relative to the Josephson oscillation generated by the Josephson junction of the sensor.

DETAILED DESCRIPTION OF THE INVENTION

While the invention will be described in connection with specific and preferred embodiments, it will be understood that it is not intended to limit the invention to those embodiments. To the contrary, it is intended to cover all alterations, modifications and equivalents as may be included within the spirit and scope of the invention as defined by the appended claims.

Throughout the present disclosure, where it is described that the structure comprises or includes specific components or processing steps, it is within the contemplation of the inventors that the structure "consists essentially of", or "consists of", the described components or processing steps.

In the present disclosure, the various aspects of the present invention are described in connection with a digital SQUID. However, the various aspects of the present invention are not limited to a digital SQUID. That is, the various aspects of the present invention have applicability to Josephson signal detectors in general, having a sensor with at least one Josephson junction, and a comparator (e.g., analog-to-digital converter) which may or need not form part of the sensor.

In connection with the first aspect of the present invention, those aforementioned problems, i.e., the reflection of the radio-frequency waves, the crosstalk and the fluctuation of the ground potential, which are not caused before the measurement of the magnetic flux signal and the digital signal processing of the SQUID are combined, can be either completely eliminated, or reduced in their influences to one-hundredth or less than those of the prior art, as will be detailed hereinafter, by powering the SQUID and the signal readout circuit by the DC current source.

Figure 1A:
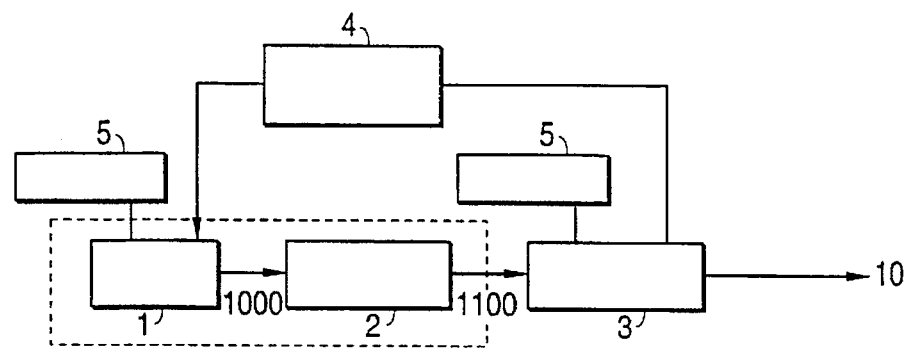
FIG. 1(a) is a block diagram for explaining a first aspect of the present invention.

FIG. 1(a) is a block diagram showing the concept of the digital SQUID of the present invention on the basis of a representative mode of embodiment of the invention. This embodiment is illustrative, the invention being defined in its full scope by the appended claims. An analog signal 1000, which is produced in the SQUID 1 in response to either a magnetic flux itself or a magnetic flux established by a current signal, is inputted to a comparator 2 and converted into a digital signal 1100. This digital signal 1100 is transmitted to feedback means 4, an output processor and a display circuit (not shown) through a readout circuit 3 which is powered by a DC current source 5. Shown by reference character 10 in FIG. 1(a) is an output signal, passing to the output processor and/or display circuit. The feedback means 4, output processor and display circuit can enhance the effects of the present invention when used together.

The readout circuit 3 has not only a function to latch the digital signal coming from the comparator 2 at a constant timing, but also functions to output the value to the external circuit or the output processor and the display circuit and to output a signal corresponding to the amount of feedback to the feedback means 4 for controlling operations by the feedback to the SQUID 1. On the other hand, the readout circuit 3 can be given, if necessary, another digital signal processing function such as multiplying, averaging and digital filter operations. According to the construction thus made, it is possible to enhance the performance and function of the SQUID by making use of the digital signal processing technique, unlike the analog method, and to avoid increase in noise, deterioration of measurement accuracy and miss operation of the systems, which have troubled the digital SQUID powered by the AC current source.

Here will be described in detail how the construction of this aspect of the present invention can solve problems of the prior art.

The comparator 2 or one component of this aspect of the present invention may be powered by either an AC current source or the DC current source, because the comparator 2 is provided to correspond one-to-one to the SQUID so that the comparator can be reset by changing the power supply current after the measurement of each SQUID even if a plurality of digital SQUIDs are provided. As a result, even if an AC current source is employed, noise caused by resetting the comparator 2 can be prevented from influencing the measurement result of either the magnetic flux itself by the SQUID 1 or the magnetic flux established by the current signal, by sacrificing measurement speed. As a result, even if only the comparator 2 is powered by the AC current source, no noise is caused in the digital SQUID so that the measurement accuracy is not influenced. Thus, the power supply by the AC current source can be made possible by devising the operating method, because the comparator 2 acts as a latch to latch the information so that the timings for the measurement and the resetting can be completely divided. There can naturally be attained a special advantage that the operation timing as a system can be facilitated, without sacrificing the measuring speed, i.e., the band, if the comparator 2 is powered by the DC current source. Thus, it is apparent that the object of the present invention can also be achieved in this case.

In the digital SQUID of the present invention, neither the SQUID 1 nor the readout circuit 3, that is, neither of the components other than the comparator 2 shown in FIG. 1(a), can be operated separately of the timing of measuring the magnetic flux itself or the magnetic flux established by the current signal. This will be reasoned in the following. Firstly, the comparator 2 can be merely reset so that all comparators, if in plurality, can be reset all at once and easily controlled. To the contrary, the readout circuit 3 is a signal processing circuit using a Josephson logic circuit and has functions to process the digital signal of the measurement result and to control the feedback signal, but has far more complex operations than those of the comparator. In case, therefore, there is used a readout circuit 3 powered by an AC current source, this power source has to be repeatedly turned ON and OFF during the measurement of the magnetic flux itself or several times during the measurement of the magnetic flux established by the current signal, so that noise is inevitably caused. If, therefore, the operation of the readout circuit 3 is to be isolated from the measurement timing, a large-scale logic circuit for controlling the timing is additionally required to enlarge the size of the system. Due to the drop of the speed, moreover, the circuit has its signal processing ability drastically lowered.

Secondly, in order to realize a function similar to that of the FLL of the prior art in the digital SQUID, it is necessary to repeat the measurements by the SQUID of either the magnetic flux itself or the magnetic flux established by the current signal, while controlling the magnetic flux itself or the input signal of the magnetic flux established by the current signal, by the feedback. This makes it necessary that the readout circuit 3, for outputting the signal corresponding to a predetermined feedback to the feedback means 4, be operated at the same timing as that of the SQUID 1. Thus, the circuit has to be constructed such that the SQUID 1 and the readout circuit 3 are operated at absolutely the same timing and such that no noise is caused due to the signal reflection, the crosstalk, and the fluctuation of the ground potential.

According to the present invention, those two components, i.e., the SQUID 1 and the readout circuit 3, are constructed of the Josephson logic circuits powered by DC current sources, so that noise due to the aforementioned problems is not caused, as will be reasoned in the following.

Since a DC current source is used, no crosstalk due to induction is established. Because of the DC current source, moreover, no reflection is established at the impedance mismatching portion. Still moreover, the Josephson logic circuit powered by the DC current source is generally operated by switching the current to one of two or more current paths. As a result, the current to flow from the power source to the ground is invariable even with the switching of the aforementioned logic circuit, i.e., by switching the current from one path to another, so that the fluctuation of the ground potential is so small as to be negligible.

In the Josephson logic circuit powered by the AC current source, on the other hand, the impedance of the Josephson junction highly changes before and after the switching so that the current to flow to ground is changed as a result of the switching, to cause noise. Since the power supply current is alternating current, the current to flow to ground highly fluctuates. As a result, the ground potential is established depending upon the value of the inductance existing in the wiring or the ground plane. In order to improve measurement accuracy, therefore, the frequency of the AC current source has to be lowered to suppress noise due to the induction. For this necessity, the measurement band is restricted. These problems, which are caused by using a Josephson logic circuit powered by an AC current source, can be easily solved by the present invention. Especially as to the measurement band, no consideration is required of the fluctuation of the ground potential, so that the measurement band can be increased to about several GHz, which is impossible in the prior art.

In case a plurality of digital SQUIDs are included, on the other hand, a multiplexer can be used as a portion of the readout circuit so that the system can be constructed by using one or more processors commonly for the plurality of digital SQUIDs. As a result, the plurality of magnetic fluxes themselves, or the magnetic fluxes established by the current signal, can be simultaneously measured to reduce the circuit scale and accordingly, the size of the system.

In order to exploit the concept of the present invention, it is most desired that the SQUID, the comparator and the readout circuit are monolithically integrated over a common chip and are all placed under cryogenic conditions. In the measurement system, the ground planes of the sensor and the comparator are arranged as separate superconducting films and have no superconducting connection between them. Therefore, no superconducting shielding current flows through the ground planes. Accordingly, noise caused by shielding current is suppressed in the measurement system. This makes it possible to reduce the noise coming from the outside, such as the circuit placed at room temperature, and to shorten the wiring between those components, so that measurements can be speeded up by raising the drive frequency.

In order to exploit the concept of the present invention, moreover, at least one of the comparator and the readout circuit is desirably equipped with reset means for returning the readout circuit, which has been switched according to the output signal of the SQUID, to the state before being switched. Usually, the output signal of the SQUID is weak, and the change of this value is detected by the comparator. In case the readout circuit powered by the DC current source is operated without using the reset means, it is necessary to switch and reset the readout circuit by the output signal of the SQUID. This switching operation can be realized by superposing a constant bias current on the signal of the SQUID, but the resetting operation is difficult to reliably accomplish because the output signal of the SQUID is weak. This makes it extremely desirable for exploiting the concept of the present invention to use the reset means together. Thus, the mere combination of the prior art between the SQUID and the Josephson logic circuit fails to effect complete operations of the digital SQUID. Thus, the digital SQUID to be realized by the present invention can provide the effect which cannot be attained merely by combining the SQUID and the Josephson logic circuit of the prior art. In order to clarify this fact more, it is numerically indicated how low a noise the digital SQUID of the present invention has and how highly sensitive the measurement of the same is.

Figure 1B:
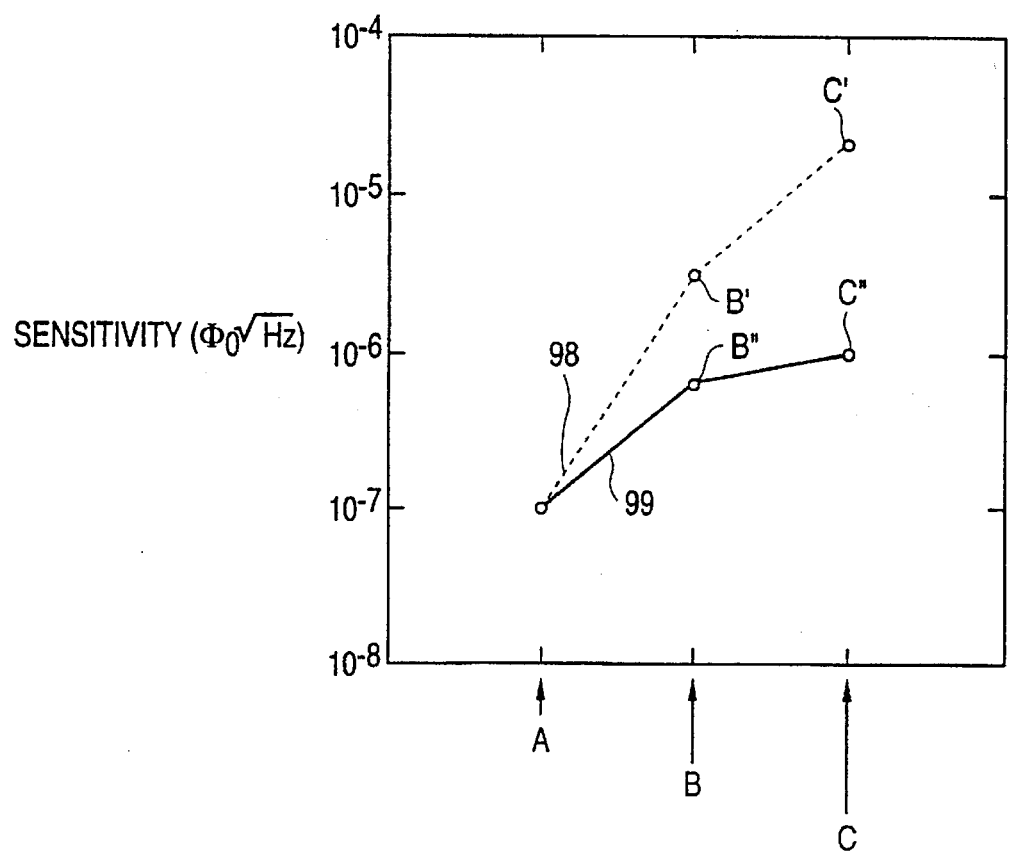
FIG. 1(b) is a diagram of sensitivity characteristics for various digital SQUIDs, within and outside the scope of the present invention, illustrating improvement in sensitivity as a result of reduction of noise achieved by the present invention.

The sensitivity characteristics of the digital SQUID according to the present invention are plotted in FIG. 1(b). This figure illustrates the magnitudes of noise of the single (intrinsic) SQUID (A), the combination of the SQUID and the comparator (B), and the combination of the SQUID, the comparator and the readout circuit (C) (SQUID with MUX), in comparison with that of the prior art. The upper curve 98 in FIG. 1(b) represents a prior art SQUID, while the lower curve 99 represents a SQUID of the present invention. At B" the SQUID has an additional comparator, while at B' the SQUID acts as a comparator. At C' the combination measured on the upper curve 98 had an AC-powered JJ (Josephson junction) circuit, and the combination measured on the lower curve 99, at C", had a DC-powered JJ circuit. According to the present invention, the sensitivity can be enhanced to twenty or more times as high as that of the prior art, i.e., to less than $1/10^6$ ($\Phi_o/\sqrt{}$+e.fra Hz+ee). As a result, the detection of a magnetic field which is emitted from a brain can be detected, unlike the prior art, so that the measurement of a remarkably high sensitivity can be realized.

As has been described hereinbefore, according to the construction of the present invention it is possible to realize a digital SQUID having a low noise and a high performance, and a measurement system using the digital SQUID.

According to the construction of the second aspect of the present invention, the comparator can be given a filter action for the AC current due to the AC Josephson effect. Specifically, by using the turn-on delay intrinsic to a Josephson junction, the Josephson junction composing the comparator does not respond to a change in input current having a higher frequency than a constant frequency.

Figure 8:
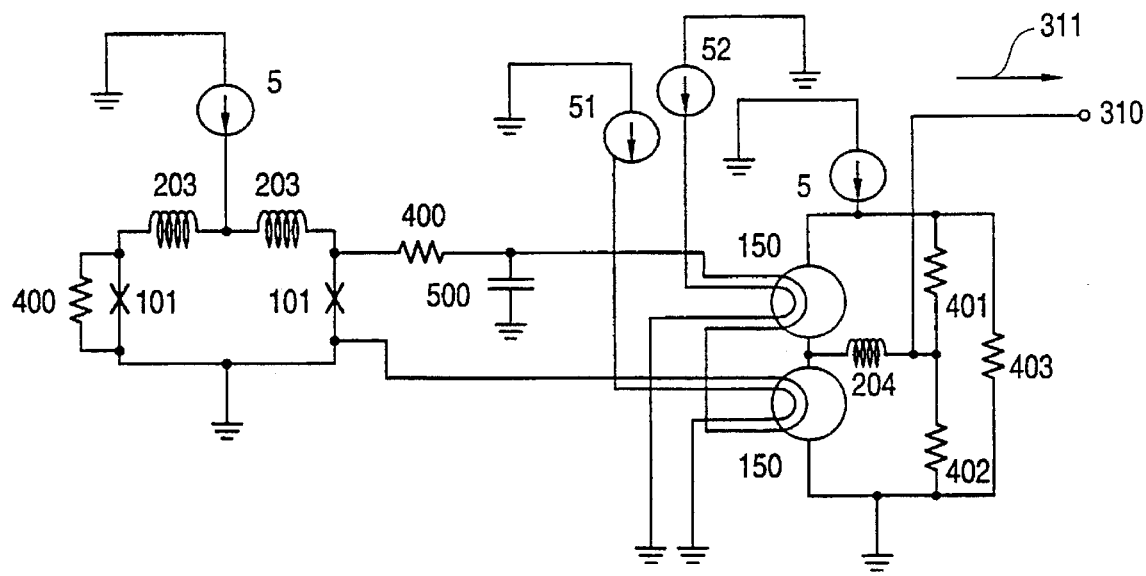
FIG. 8 is a circuit diagram showing another embodiment of the present invention, having a low-pass filter.
Figure 38:
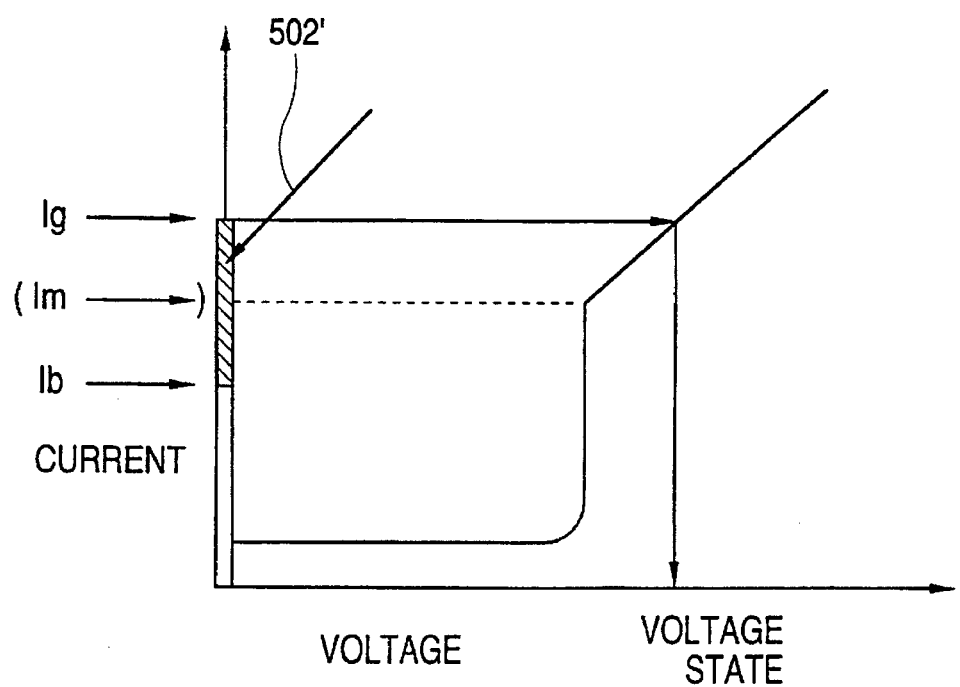
FIG. 38 is a diagram of current-voltage characteristics of a comparator.

The switching operation of the comparator will be described in more detail with reference to FIG. 38. FIG. 38 presents the current-voltage characteristics of a Josephson junction or Josephson quantum interference device composing the comparator. The comparator can be constructed of either the Josephson junction and a resistor or a Josephson quantum interference device, and the effect of the turn-on delay can be similarly described for both cases. In FIG. 38, letter Ib designates a bias current, and the comparator switches when the sum Ig of the bias current Ib and the signal current inputted to the comparator exceeds for a constant time period or longer the maximum Im of the superconducting current to be fed in the superconducting state to the comparator. In FIG. 8, 502' represents the signal current from the superconducting quantum interference device, which is the aforementioned signal current inputted to the comparator.

As stated previously, the comparator 2 can provide a filtering effect to the Josephson oscillation caused by the sensor during operation, when the comparator is so provided as not to respond to the Josephson oscillation (e.g., not to respond to current maxima that are at such maxima for short time periods). This can be achieved by providing the Josephson junction forming the comparator with a capacitance, or by providing a capacitor in parallel with the Josephson junction forming the comparator, such that the total capacitance is sufficiently large to provide the filtering effect. In other words, the total capacitance should be sufficient to satisfy the following Formula 1:

$$V \geqq \frac{1}{2.95} \sqrt{\frac{2\pi(Ig - Im)\Phi_o}{C}} \quad \text{(Formula 1)}$$

where C is the total capacitance (i.e., capacitance of the Josephson junction, or, where additional capacitors are present, sum of capacitances of the Josephson junction and capacitors parallel thereto), Ig is the current value after a signal is inputted to the comparator, Im is the critical current of the comparator, V is the output voltage during operation of the sensor and $\Phi_o$ is the magnetic flux quantum.

The comparator can include a Josephson quantum interference device having an inductance made of a superconducting element, and a resistor in parallel with the inductance. Where the comparator includes such Josephson quantum interference device, in order to provide a desired filtering effect by the comparator the following Formula 2 should be satisfied:

$$R \leqq \sqrt{\frac{L}{8C}} \quad \text{(Formula 2)}$$

where C has been previously defined, L is the inductance of the superconducting element and R is the resistance of the resistor of the comparator.

Preferably, Formulae 3 or 4 is also satisfied, in addition to Formula 2, so as to achieve the objectives of this aspect of the present invention:

$$V > \frac{\Phi_o}{2\pi\sqrt{\frac{LC}{2}}} \quad \text{(Formula 3)}$$

or $$V < \frac{\Phi_o}{2\pi\sqrt{\frac{LC}{2}}} \quad \text{(Formula 4)}$$

where V, $\Phi_o$, L and C have been previously defined.

The value Ig has to exceed the value Im for a constant time period or longer so that the comparator may switch. This constant time period is usually called the "turn-on delay ($\tau_D$)" of the Josephson junction, as expressed in the following Formula 5 by the value Im and either the electrostatic capacitance C of the Josephson junction or the sum C of the electrostatic capacitance in the Josephson junction and any capacitor in parallel with the Josephson junction:

$$\tau_D \approx 2.95 \sqrt{\frac{C\Phi_o}{2\pi(Ig - Im)}} \quad \text{(Formula 5)}$$

Figure 37:
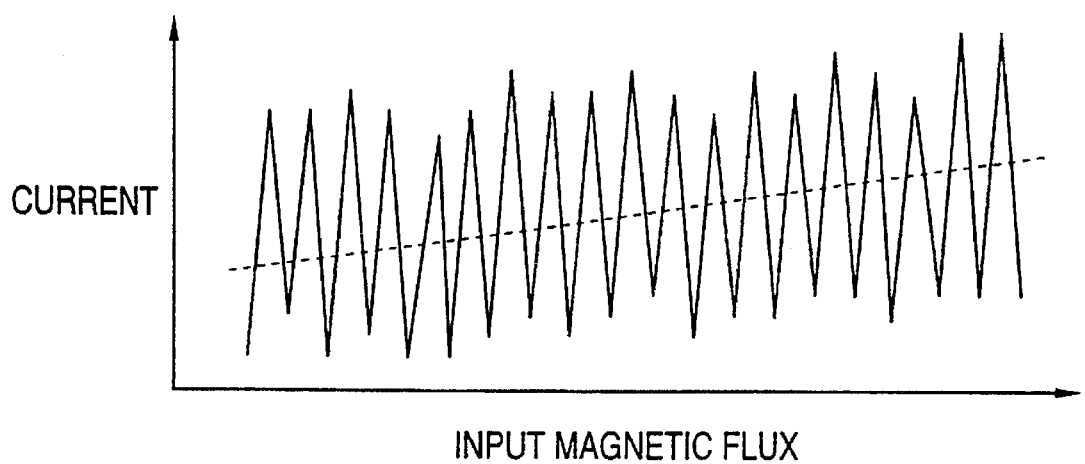
FIG. 37 is an output signal waveform of a SQUID having AC noise.
Figure 39:
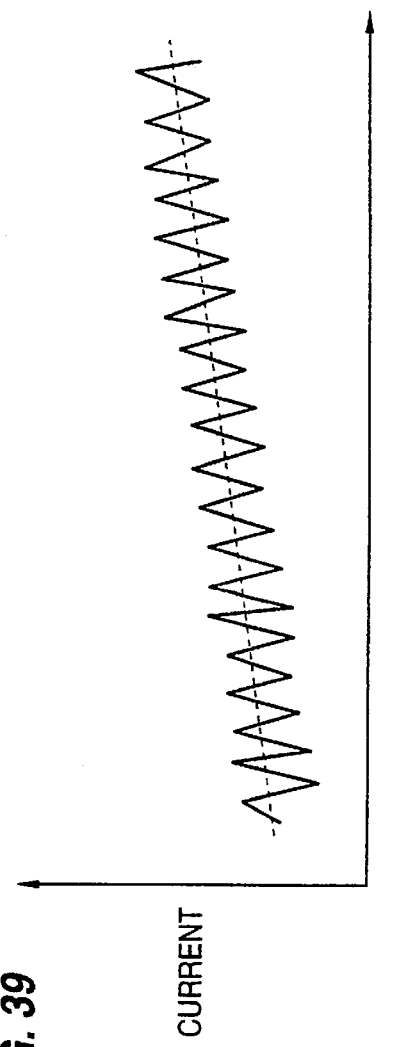
FIG. 39 is a diagram showing an output signal waveform of an equivalent SQUID sensed by a comparator.

The characteristic frequency, corresponding to the time period of turn-on delay, is $f_1$. Due to the turn-on delay, the Josephson junction in the comparator does not respond to an AC-signal whose frequency is higher than $f_1$. Therefore, the Josephson junction has low-pass characteristics whose cut-off frequency is $f_1$. In the equivalent waveform, which is detected by the Josephson comparator, the AC-signal is suppressed compared with the original signal (the original signal being shown in FIG. 37), as shown in FIG. 39.

In other words, where the frequency corresponding to the turn-on delay time of the comparator is designated as $f_1$, the Josephson junction composing the comparator senses the input signal having a frequency higher than the value $f_1$ as if the signal were substantially lower, and makes no response. Thus, it is possible to achieve the same effect as that which might be achieved by equipping the comparator with a low-pass filter, as illustrated in FIG. 39 (as compared to FIG. 37). If the frequency $f_1$ corresponding to the turn-on delay is lower than the frequency $f_2$ of the noise due to the AC Josephson effect, as generated when the Josephson junction of the sensor is in the operating state, it is possible to reduce the influences of the noise due to the AC Josephson effect to be received by the comparator.

The frequency $f_2$ of the noise due to the AC Josephson effect corresponds to the value which is determined by subtracting the output voltage V of the Josephson junction of the sensor by the magnetic flux quantum $\Phi_o$. Hence, the frequency $f_2$ depends upon what value the output voltage V is to be set for using the sensor, and takes the smaller value for the lower frequency $f_2$.

In order to reduce the frequency $f_1$ corresponding to the turn-on delay time, it is sufficient to change the electrostatic capacitance C of the Josephson junction or the sum C of the electrostatic capacitance of the Josephson junction and the electrostatic capacitor in parallel with the Josephson junction, and the value Im, as is apparent from Formula 5. Specifically, it is sufficient to increase the value C and to decrease the value Im. As a matter of fact, if the value Im is decreased, the current to be outputted to the circuit of the next stage when the comparator is switched is reduced, if no special device is made. Thus, there arises a problem that the Josephson logic circuit connected with the comparator will not normally operate. Therefore, the method of increasing the turn-on delay by changing the value Im only is not practical.

On the other hand, the Josephson junction has its electrostatic capacitance determined by the area of the junction and the dielectric constant of the material of the tunnel barrier layer. Since the junction area is difficult to arbitrarily change, the material of the tunnel barrier layer desirably is changed to another having a larger dielectric constant so as to increase the electrostatic capacitance of the Josephson junction.

To the contrary, the electrostatic capacitor in parallel with the Josephson junction can be easily changed because it may be connected in parallel with the Josephson junction. Thus, it can be understood that a new capacitor may be newly connected in parallel with the Josephson junction so that the turn-on delay may be increased without changing the characteristics of the Josephson junction of the comparator. At this time, the circuit can be prevented from being increased in size even by adding a capacitor, if this capacitor is provided by extending the two superconducting electrodes composing the Josephson junction and by using the extensions as the electrodes of the capacitor.

Figure 40:
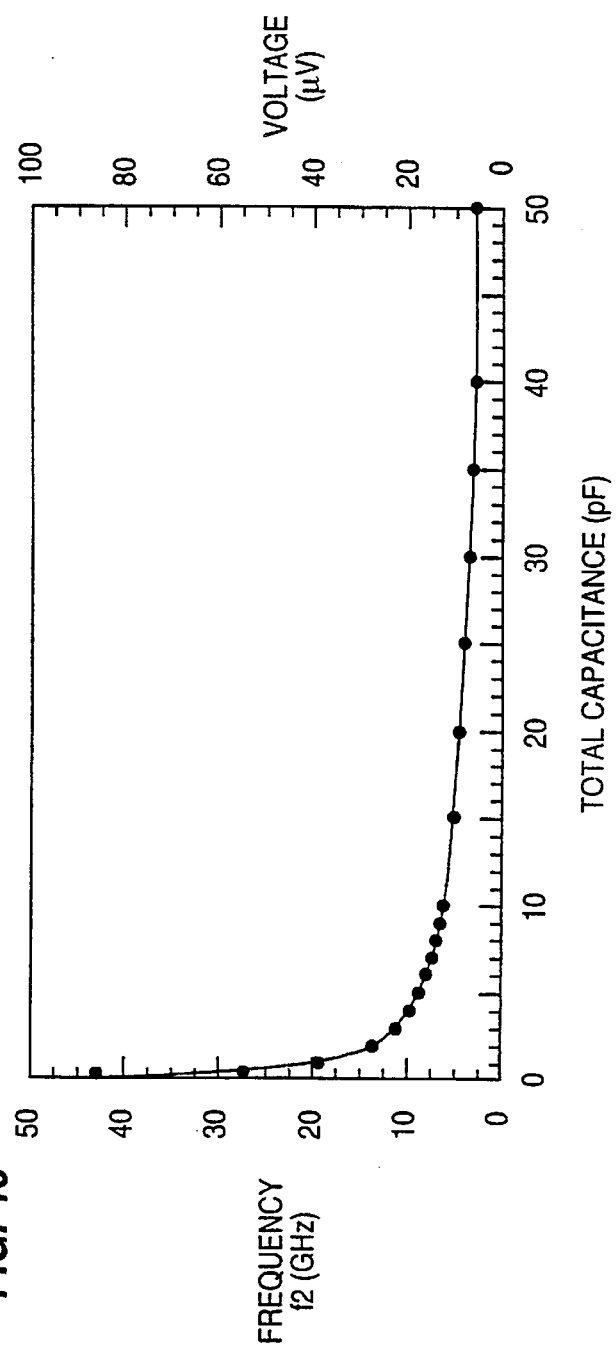
FIG. 40 is a diagram illustrating a relation between electrostatic capacitance and turn-on delay.

FIG. 40 presents a relation between the value C of the electrostatic capacitance and the turn-on delay. Here, the difference between the current to flow through the Josephson junction after the switching operation corresponding to the so-called "over drive" and the maximum superconducting current of the Josephson junction is set to 1 μA. In FIG. 40, there are plotted both the frequency f2 of the noise due to the AC Josephson effect to be filtered by the turn-on delay and the corresponding voltage V of the SQUID. If the SQUID and the comparator are used for the individual values C at a higher voltage than that of the SQUID, as shown, the effect of the current noise due to the AC Josephson effect can be reduced to make a more accurate measurement possible.

In case the Josephson signal detector is constructed according to this aspect of the present invention, Table 1 enumerates the recommended values of the sum C of the electrostatic capacitance of the Josephson junction contained in the comparator and the electrostatic capacitor connected in parallel with the former, and the operating voltage of the Josephson junction contained in the sensor.

TABLE 1

| Sum (pF) of Electrostatic Capacitances of Josephson Junction and Capacitor Portion of Comparator | Value (μV) of Operating Voltage of Josephson Junction of Sensor |
|---|---|
| 0.2 | 86.4 or more |
| 0.5 | 54.7 or more |
| 1.0 | 38.7 or more |
| 2.0 | 27.3 or more |
| 3.0 | 22.3 or more |
| 4.0 | 19.3 or more |
| 5.0 | 17.3 or more |
| 6.0 | 15.8 or more |
| 7.0 | 14.6 or more |
| 8.0 | 13.7 or more |
| 9.0 | 12.9 or more |
| 10.0 | 12.2 or more |
| 15.0 | 9.98 or more |
| 20.0 | 8.64 or more |
| 25.0 | 7.73 or more |
| 30.0 | 7.06 or more |
| 35.0 | 6.53 or more |
| 40.0 | 6.11 or more |
| 50.0 | 5.47 or more |

The comparator may be constructed of a single Josephson junction or a circuit having a Josephson junction and a resistor in combination. Moreover, the comparator may also be constructed of a Josephson quantum interference device including two or more Josephson junctions. In case a plurality of Josephson junctions are contained in the comparator, the turn-on delay of the comparator can be enlarged according to the concept of the present invention if the Josephson junction to be switched at first to the voltage state in response to the input signal satisfies the conditions, as enumerated in Table 1.

As has been described hereinbefore, according to the construction of this aspect of the present invention it is possible to solve the problems belonging to prior proposals and to realize both a Josephson signal detector, which has a high measurement accuracy and which is excellent in the operation stability, and a measurement device which is constructed to include the Josephson signal detector.

In the following, various embodiments of the different aspects of the present invention are discussed. In the drawing figures, like components, where represented by the same reference character, have a same function, and repeated discussion thereof will not be made.

Embodiment 1

An embodiment according to the first aspect of the present invention will be described in the following. FIGS. 2 to 7 are circuit diagrams showing the components enclosed by broken lines in FIG. 1(a), illustrating a construction according to principles of the present invention, that is, a SQUID 1 and a comparator 2. In the construction diagram shown in FIG. 1(a), according to the present embodiment, not only the SQUID 1 but also the comparator 2 and the readout circuit 3 are constructed of a circuit including a Josephson junction element powered by a DC current source. The comparator 2 acts as a 1-bit analog-to-digital converter for digitizing the output signal coming from the SQUID 1. The readout circuit 3 produces a feedback signal according to the digital output coming from the comparator 2 and sends it to feedback means 4. The increase and decrease in the feedback are decided by the readout circuit 3. Moreover, the digital signal processing such as the signal integration or the digital filtration can also be executed by the readout circuit 3. The setting of the timing for the magnetic flux measurement can be realized, if desired by the clock, by giving the readout circuit 3 a latching function synchronized with the clock. The discussion made above is applied to other embodiments to be described in the following.

Figure 2:
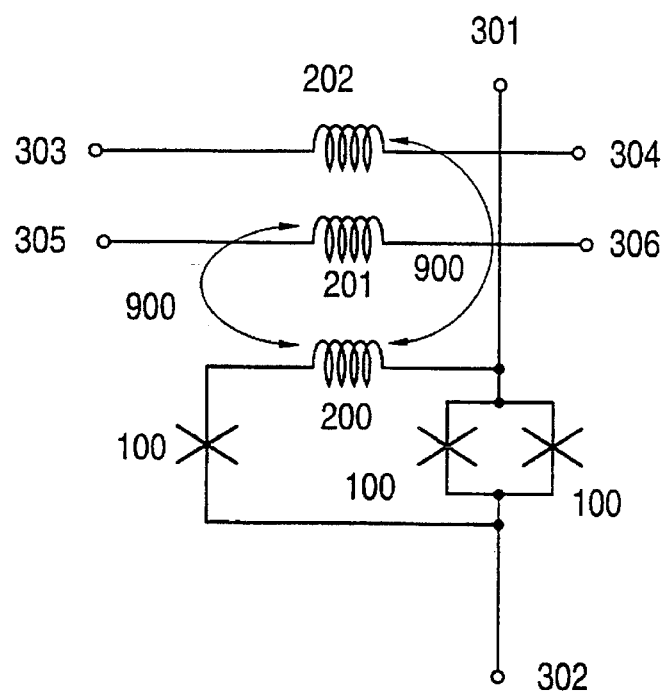
FIG. 2 is a circuit diagram of a Josephson quantum interference device.
Figure 3:
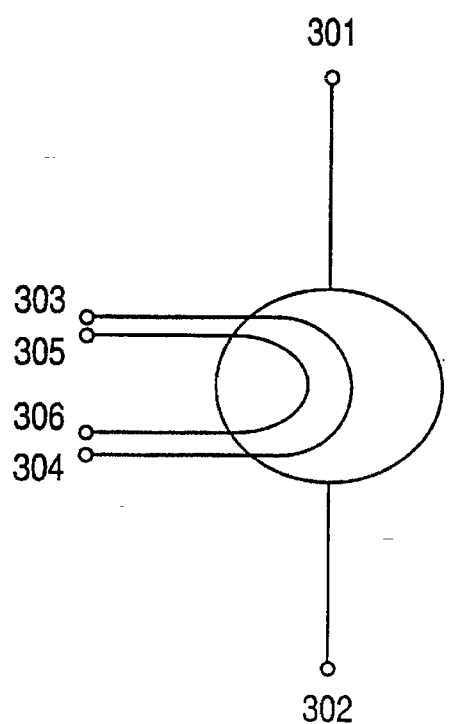
FIG. 3 is a shorthand notation for the circuit of the Josephson quantum interference device (e.g., SQUID).

FIGS. 2 to 7 are circuit diagrams showing the construction in a case in which the output of the SQUID is digitized by using the comparator powered by the DC current source. This comparator is constructed of a flip-flop type Josephson circuit which uses a Josephson quantum interference device and which is powered by a DC current source. FIG. 2 is a circuit diagram showing the Josephson quantum interference device composing the comparator. In FIG. 2, 301, 302, 305 and 306 are current source terminals; 303 and 304 are signal input terminals; 200, 201 and 202 represent an inductance; 100 is a Josephson junction; and 900 represents magnetic coupling. In the following circuit diagrams showing the embodiments of the present invention, the Josephson quantum interference device is illustrated as in FIG. 3 (that is, FIG. 3 is a shorthand notation for the Josephson quantum interference device shown in FIG. 2).

Figure 4:
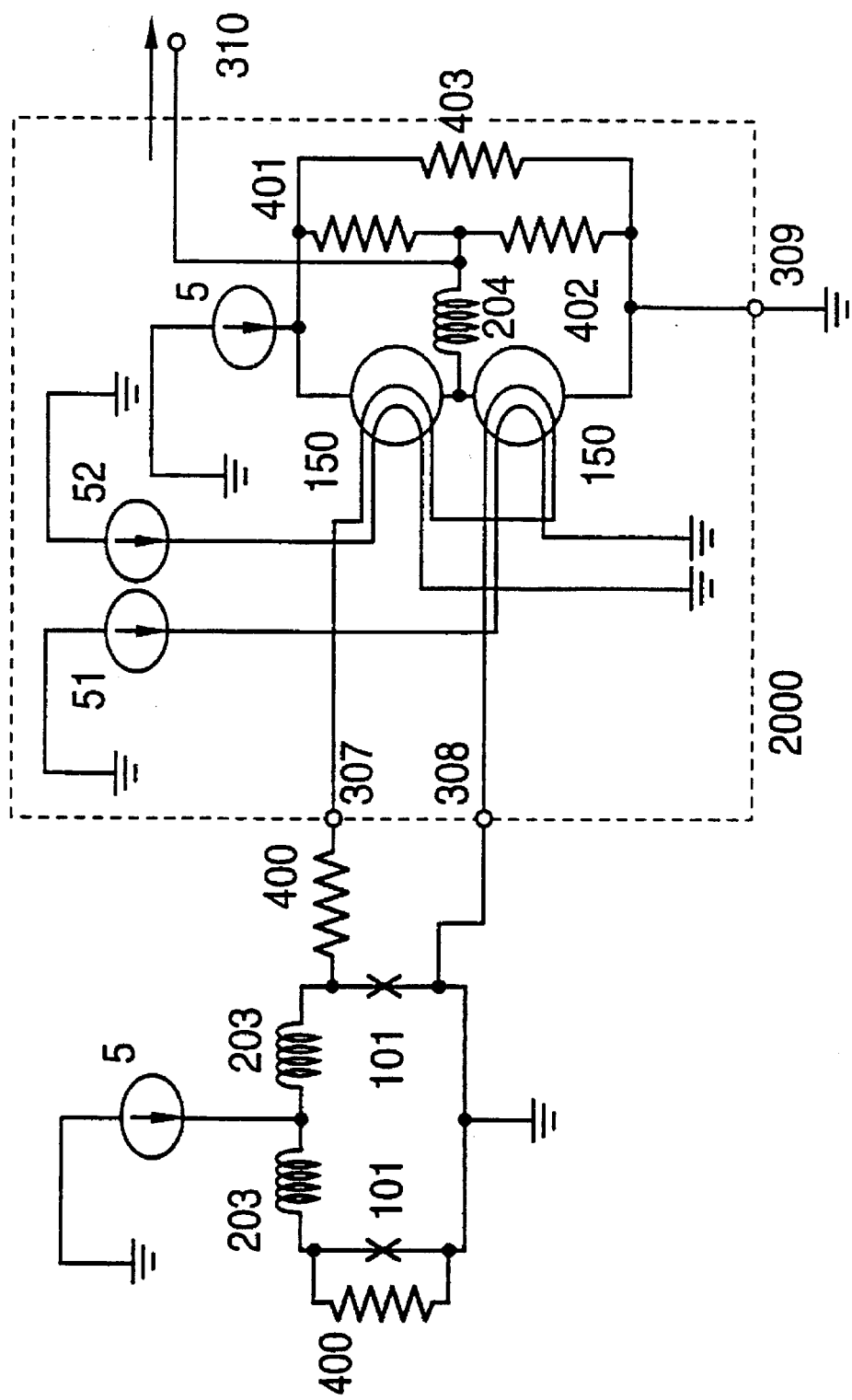
FIG. 4 is a circuit diagram of a digital SQUID according to the present invention, showing a case in which a comparator powered by a DC current source is used.

In FIG. 4, a comparator 2000 is a flip-flop constructed to include a circuit which is powered by a DC current source 5 and which is made by connecting in parallel a series-connected structure of at least two Josephson quantum interference devices 150 and a series-connected structure composed of two load resistors 401 and 402, and by connecting the intermediate points of those two series-connected structures through an inductance 204. The flip-flop thus constructed is operated by bringing one of the Josephson quantum interference devices into a voltage state and the other into a superconducting state in response to the signal input to the two Josephson quantum interference devices. A DC current source 52 is provided for setting the operating point of the comparator 2000. Moreover, a DC current source 51 is used as the reset means for reversing the sign of the output of the comparator into a current having the opposite sign by feeding the current signal from DC current source 51, thereby to reset the readout circuit. The reset means is disposed in the comparator in the present embodiment, but may be disposed in the readout circuit.

The SQUID is driven by the DC current source 5 and composed of two a Josephson junction 101s, an inductance 203 and a resistor 400. In the SQUID of the present embodiment, the inductance 203 and the Josephson junction 101 are designed to have their capacitances symmetrically divided, so as to optimize the elimination by the damping resistor of the voltage step by the LC resonance. Although not shown, the change in the output voltage of the SQUID, which is caused by the change in the magnetic flux signal inputted from the magnetic flux input means to the SQUID, leads to a change in the current through the resistor 400 so that the current from a signal inputting terminal 307 to a signal inputting terminal 308 changes. This change in the current is magnetically coupled through the inductance to the Josephson quantum interference devices composing the comparator, so that the signal is inputted to the comparator. As a result, the change of the magnetic flux signal is converted into a digital signal and outputted to a signal outputting terminal 301 (e.g., then to a readout circuit). Since both the SQUID and the comparator are constructed of superconducting elements, they can be fabricated over a common (single) chip by ordinary processing techniques of an integrated circuit having superconducting elements of Nb. Of the components shown in FIG. 1, the SQUID 1, the comparator 2 and the readout circuit 3 may all be formed over a common chip. In addition, the feedback means 4 and the magnetic flux input means, although not shown, may be formed over this common chip.

Since the SQUID, the comparator and the readout circuit are thus powered by a DC current source, crosstalk can be reduced to eliminate miss operation, as compared with a digital SQUID powered by an AC current source. In case similar functions are realized by the digital SQUID powered by the AC current source, the AC current of the source reaches as high as about 20 mA if the gate number of the comparator and the signal readout circuit is assumed to be forty gates. In the present invention, on the contrary, what requires the AC current is the clock signal having a value as small as about 0.1 mA, which is necessary in case the measurement timing is designated from the outside. In the present embodiment, therefore, fluctuation of the ground potential, caused by the inductance of the wiring to the ground through a ground terminal 309, can be suppressed to less than about one-hundredth to reduce the noise.

Figure 5:
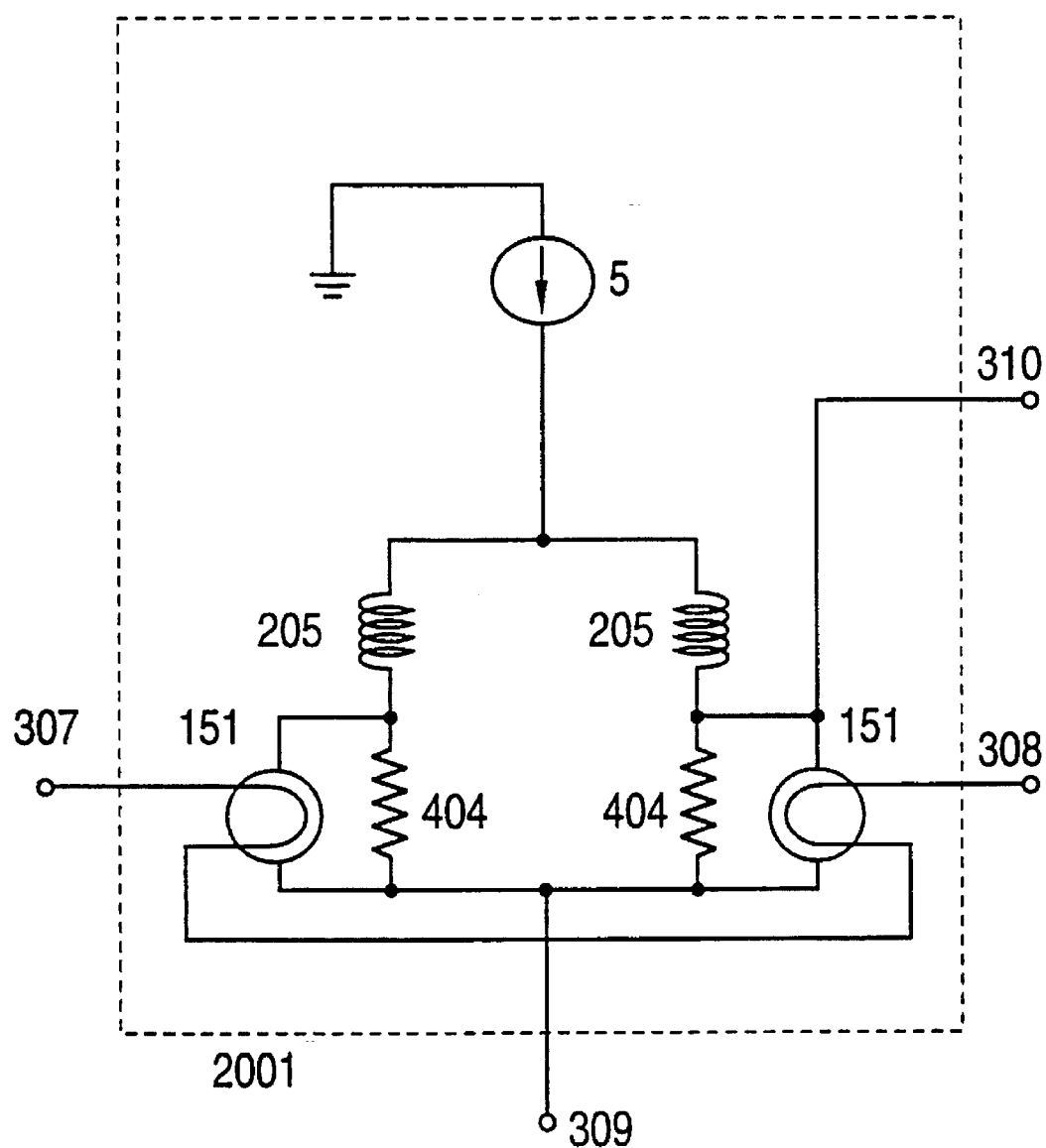
FIG. 5 is a circuit diagram showing another comparator powered by a DC current source.
Figure 6:
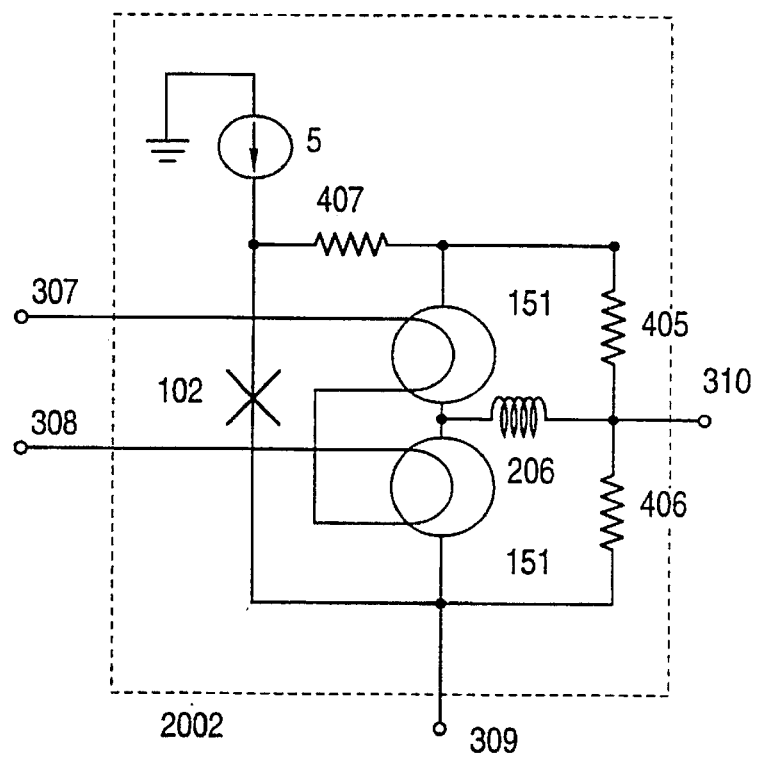
FIG. 6 is a circuit diagram showing still another comparator powered by a DC current source.

Moreover, the comparator powered by the DC current source and constructed by using the Josephson quantum interference device can be exemplified not only by the construction having its circuit diagram enclosed by broken lines in FIG. 4 but also a construction having circuit diagrams shown in FIGS. 5 and 6. FIG. 5 shows a comparator 2001 constructed of a flip-flop which is constructed of a circuit having two current paths by connecting two series-connected structures of a Josephson quantum interference device 151 and an inductance 205 in parallel and which is operated by switching the current to one of the two current paths in response to the signal input from the signal inputting terminal 307 or 308 to the Josephson quantum interference devices. As seen in FIG. 5, resistors 404 also form part of the circuit of comparator 2001.

FIG. 6 shows a comparator 2002 constructed of a flip-flop formed by connecting two Josephson quantum interference devices 151 in series to form a series-connected structure and by connecting this series-connected structure with the constant current source 5, the constant current source 5 being electrically connected to a Josephson junction 102. The comparator 2002 also includes inductance 206, and resistors 405–407. The comparator 2002 is operated by bringing one of the Josephson quantum interference devices into a voltage state and the other into a superconducting state in response to the signal input from the signal inputting terminal 307 or 308 to the Josephson quantum interference devices 151. It is apparent that similar effects can be achieved no matter which kind of comparators might be used.

The threshold current for the comparator 2000 of FIG. 4 to discriminate the input current is determined by the DC currents supplied from the DC current sources 51 and 52. As a result, the comparator acts as a 1-bit analog-to-digital converter, as described before, if the DC current is kept constant. In case, on the contrary, the aforementioned DC current is stepwise changed, the comparator discriminates the input current for two or more threshold currents so that it can act substantially as a 2-bit analog-to-digital converter. Thus, since the comparator itself is driven by the DC current source, the threshold current is changed by changing the DC current source corresponding to the bias while holding the noise at a low level, so that one comparator can be used as a multi-bit analog-to-digital converter. This usage is an advantage that can be realized not only in the present embodiment but in others.

Figure 7:
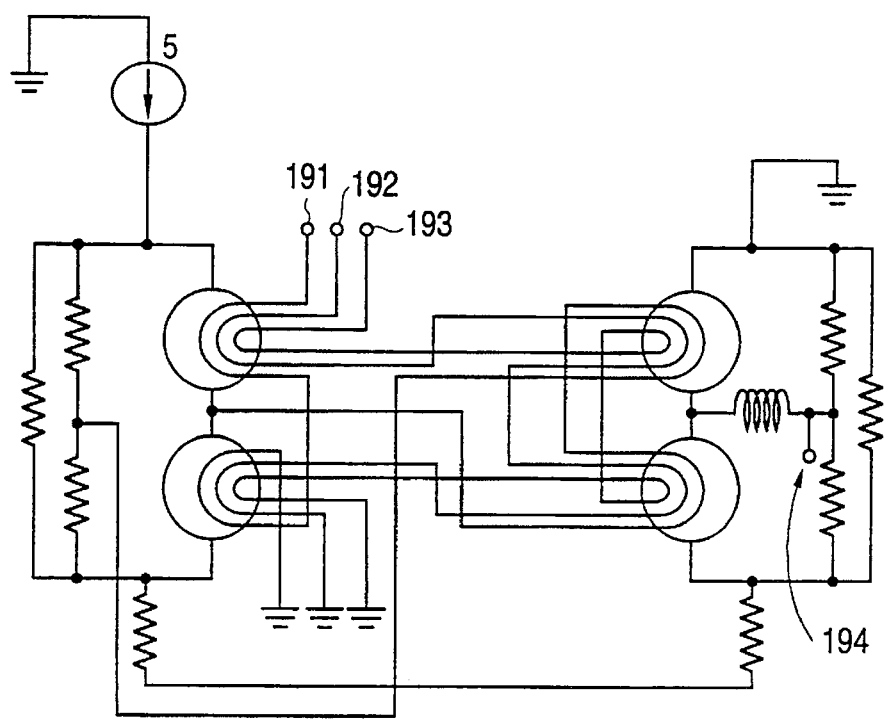
FIG. 7 is a circuit diagram showing a register powered by a DC current source.

In FIG. 1, moreover, the readout circuit 3 is constructed to include a circuit having not only a data latching function but also an integrating function for higher accuracy. FIG. 7 shows an example of the register circuit which has the latching function and is composed of Josephson quantum interference devices and which is operated by a DC current source 5. In FIG. 7, 191 is a data input, 192 is a bias current input, 193 is a clock signal input, and 194 is an output signal.

In the magnetic flux meter having a circuit diagram as shown in FIG. 8, the output of the SQUID is inputted to the comparator powered by the DC current source, by the magnetic coupling as in FIGS. 2 to 7. The output of the comparator, as shown by arrow 311, is passed to the readout circuit via signal outputting terminal 310. Into this magnetic flux meter, there is inserted a low-pass filter which is composed of a capacitor 500 and a resistor 400. Thanks to this circuit construction, the Josephson noise, which is caused by the AC Josephson effect from the Josephson junction 101 of the SQUID, can be cut by that low-pass filter to reduce the noise more and to better improve measurement accuracy.

Embodiment 2

Figure 9:
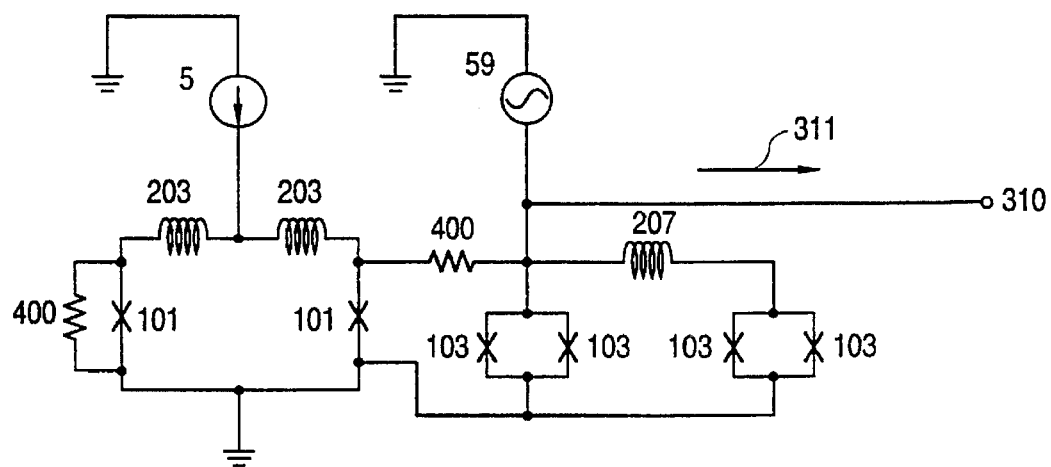
FIG. 9 is a circuit diagram showing another embodiment of the present invention, in which a comparator powered by an AC current source is used.

Here will be described another embodiment according to the present invention. FIG. 9 is a circuit diagram showing the case using a comparator powered by an AC current source 159. As a matter of fact, the circuit has the construction shown in FIG. 1, as in Embodiment 1. The output voltage of the SQUID is converted by the resistor 400 into a current component, which is injected as a signal current into the comparator composed of Josephson junctions 103 and an inductance 207. The analog voltage is converted into a digital signal by switching the comparator into a voltage state, in case the sum of the signal current from the SQUID and the current to be injected by the AC bias from an AC current source 59 exceeds the maximum superconducting current of the comparator determined depending upon the critical current value of the four Josephson junctions 103, and otherwise by holding the comparator in the superconducting state. The output of the comparator, as shown by arrow 311, is passed via signal outputting terminal 310 to the readout circuit. In the present embodiment, the AC current source is used for powering the comparator, but the noise accompanying the resetting will not adversely affect the measurement accuracy if the comparator is reset after the end of measurement. As a result, in the digital SQUID of the present invention, too, the magnetic flux meter could have its noise reduced by powering the SQUID and the readout circuit with the DC current source.

The present embodiment is of the current injection type, in which the comparator is switched by the current injected through the resistor 400. It is needless to say that there can be additionally used a magnetically coupled type comparator which is switched by the magnetic flux established by the current flowing through the resistor 400. In this modification, too, if the comparator is reset after the end of measurement, the noise accompanying the resetting will not adversely affect the measurement accuracy.

Figure 10:
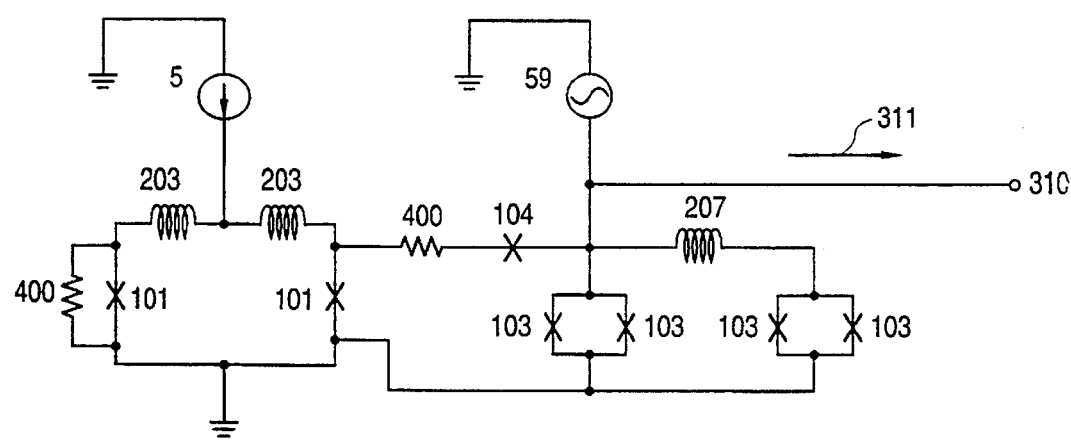
FIG. 10 is a circuit diagram of another embodiment of the present invention, which includes isolation structure.

Similar effects can also be achieved even if a Josephson junction 104 is connected as an isolation means between the comparator and the SQUID, as shown in FIG. 10, so that the current may not be caused to flow in the opposite direction from the comparator to the SQUID by the voltage which is generated when the comparator is switched from the superconducting state to the voltage state. In this case, there is achieved an effect to prevent unnecessary noise from being transmitted by the backward current from the comparator to the feedback means magnetically coupled to the SQUID, to make normal feedback operation impossible.

Embodiment 3

Figure 11:
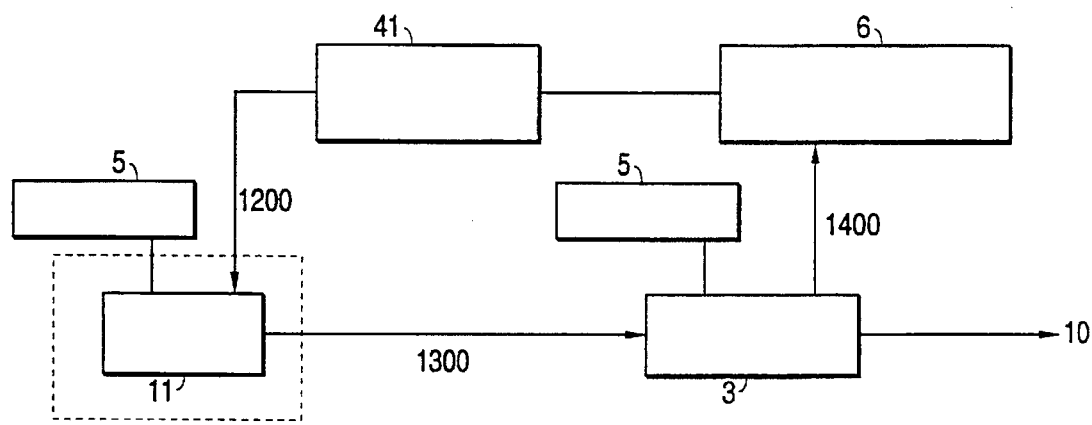
FIG. 11 is a block diagram for explaining the principle of another embodiment of the present invention.

Here will be described another embodiment according to this first aspect of the present invention. FIG. 11 is a block diagram showing the principle of another embodiment of this first aspect of the present invention. In the present embodiment, a SQUID 11 powered by a DC current source 5 also acts as the comparator so that the digital output may be obtained directly from the SQUID. Digital signal 1300 is inputted to readout circuit 3 from the SQUID. From terminal 10, the output signal from readout circuit 3 is passed to an output processing circuit and/or a display circuit.

Figure 12A:
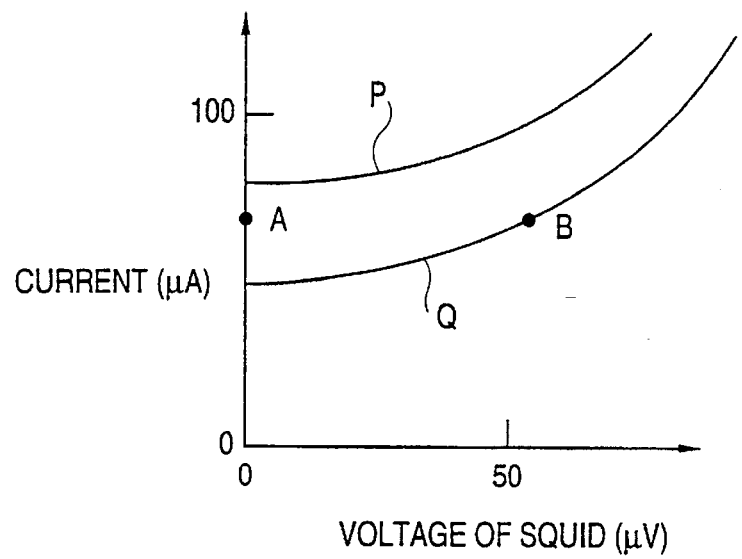
FIG. 12(a) is a diagram of current vs. voltage of the SQUID, for a biasing method of the SQUID of the magnetic flux meter of FIG. 11.

In the SQUID of the present embodiment, current having a slightly lower value than the critical current of the SQUID is fed as abias current of the SQUID, as indicated at point A in FIG. 12(a). In FIG. 12(a), curve P is a curve of current vs. SQUID voltage without the magnetic flux signal, while curve Q is a curve of current vs. SQUID voltage with a magnetic flux signal. As a result, the SQUID is changed, if fed with the magnetic flux, from the superconducting state, as indicated at point A in FIG. 12(a), to a voltage state, as indicated at point B. As the bias current is decreased, the change is more reluctant to occur without a larger change in the magnetic flux signal, so that the magnitude of the magnetic flux signal can be discriminated. Conversion into the digital signal can be effected by having the voltage state correspond to the logic value "1" or "0", and the superconducting state correspond to the other of "1" or "0".

Figure 12B:
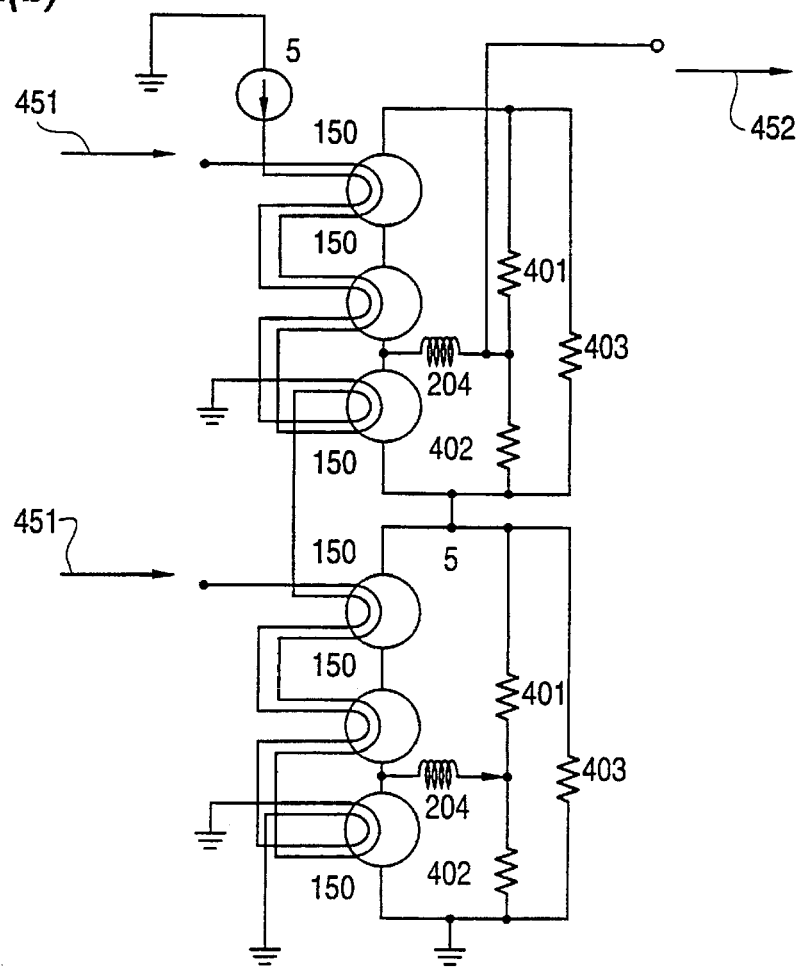
FIG. 12(b) is a circuit diagram showing a digital-to-analog converter powered by a DC current source.

In the present embodiment, the feedback means is exemplified by feedback means 41 using a superconducting coil. This superconducting coil is magnetically coupled to the SQUID 11, passing signal 1200 from the feedback means to the SQUID. In accordance with a digital signal 1400 corresponding to the feedback outputted from the readout circuit 3, a current signal is fed from a digital-to-analog converter 6 to the superconducting coil. The magnetic flux established by the superconducting coil is coupled to the SQUID 11 so that a feedback signal 1200 is transmitted to the SQUID 11. FIG. 12(b) is a circuit diagram showing the digital-to-analog converter 6. In FIG. 12(b), 451 represents the input signal, while 452 is the signal passed to the feedback means. This digital-to-analog converter 6 can be powered like the SQUID 11 and the readout circuit 3 by the DC current source 5. As a result, the object of the present invention could be achieved by reducing the noise.

Embodiment 4

Figure 13:
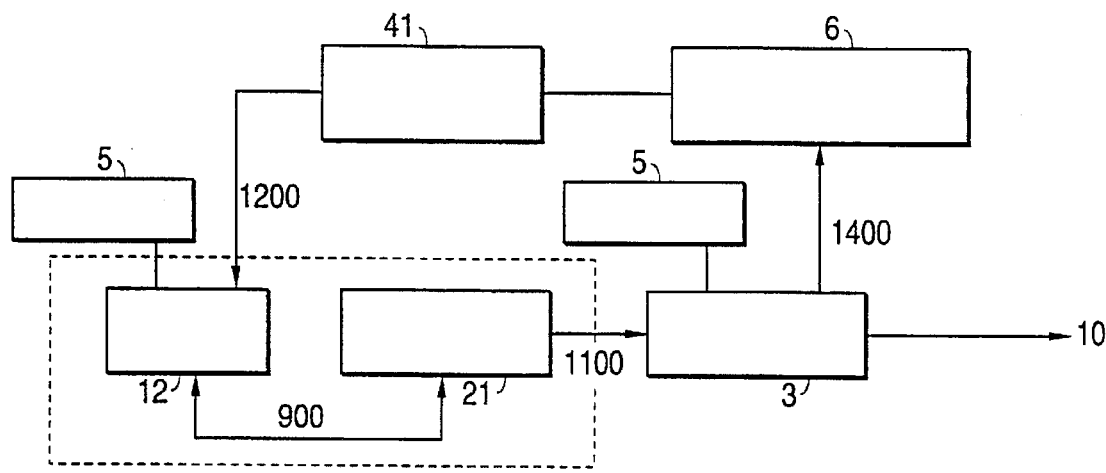
FIG. 13 is a block diagram for explaining the principle of another embodiment of the present invention.
Figure 14:
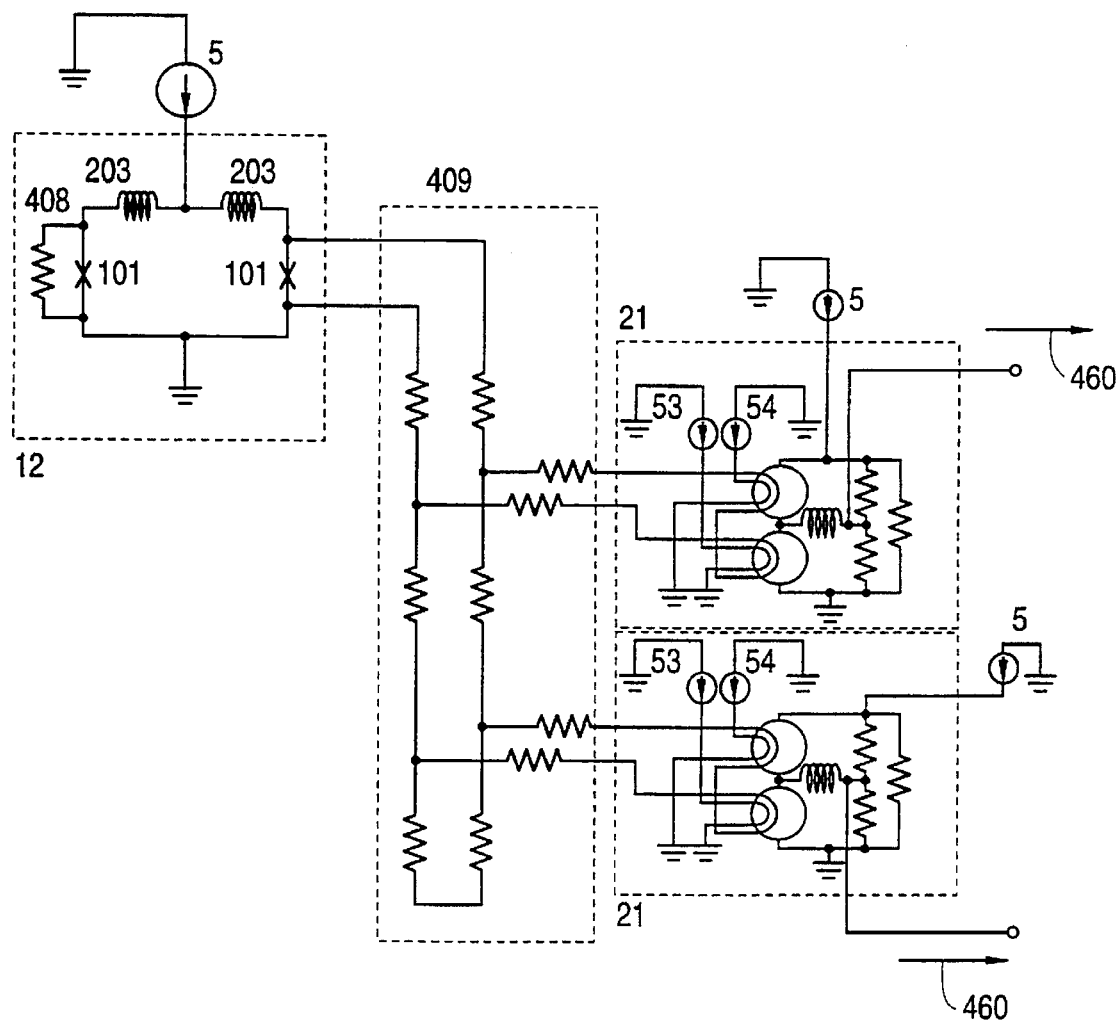
FIG. 14 is a circuit diagram of a further embodiment of the present invention in which a 2-bit analog-to-digital converter powered by a DC current source is used.

FIG. 13 is a block diagram showing the principle of another embodiment of this aspect of the present invention. In FIG. 13, a magnetic coupling 900 using an inductance is used for inputting a magnetic flux from a SQUID 12 to a comparator 21. FIG. 14 is a circuit diagram showing a case in which the means for converting the output of the SQUID into a digital signal is exemplified by a 2-bit analog-to-digital converter. This total 2-bit analog-to-digital converter is constructed by converting the voltage generated in the SQUID 12 into a current by a ladder resistor 409 and by inputting the components of the current individually to the two comparators 21. Signals 460 from the two comparators 21 are transferred to the readout circuit. The comparators 21 in FIG. 14 include DC current sources 53, 54, powering the Josephson quantum interference devices of the comparators. The SQUID has its resistor 408 given a resistance equal to the value of the ladder resistor 409.

In the case of the present embodiment, too, each of the SQUID, the analog-to-digital converter and the readout circuit was powered by a DC current source so that crosstalk and fluctuation of ground potential could be prevented, to reduce the noise. In the present embodiment, too, the construction of the feedback means 41 using the superconducting coil and the digital-to-analog converter 6 may be similar to those of Embodiment 3. In the present embodiment, too, the noise could be reduced to achieve the object of the present invention.

Embodiment 5

Figure 15:
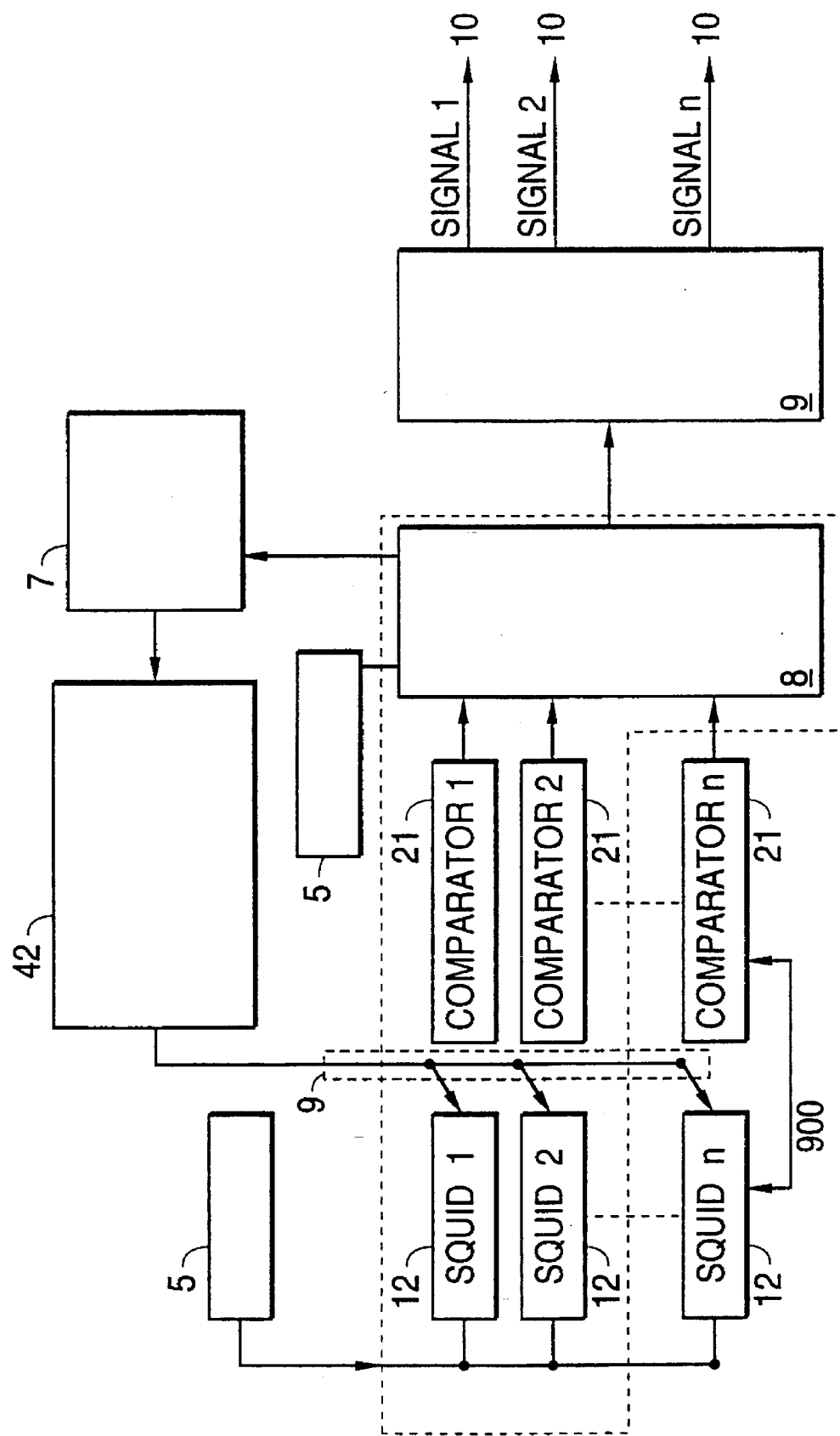
FIG. 15 is a block diagram for explaining the principle of another embodiment of the present invention.

FIG. 15 is a block diagram showing the principle of the case in which the readout circuit is constructed by using a multiplexer powered by a DC current source, in a digital SQUID magnetic flux measurement system having a plurality of digital SQUID magnetic flux meters of the present invention. Each of the SQUIDS 12 (i.e., SQUID 1, SQUID 2, ..., SQUID n) corresponds to one comparator 21 (comparator 1, comparator 2, ..., comparator n). The digital signal from each comparator is sequentially switched by a multiplexer 8 of the readout circuit and converted into serial data. Since the number of the signal wirings can be reduced here to one pair, the use of the data converted into the serial signal in the signal transmission from the cryogenic circumstance, in which the SQUID is operating, to the room temperature, is effective to lighten the load upon the refrigerator while preventing the invasion of heat. The serial signal thus transmitted is returned to a parallel signal by a demultiplexer 9 of the readout circuit so that the data are transferred to the output processing display circuit, as signals 1, 2, ..., n, via terminals 10. On the other hand, the serial feedback signal to the SQUID is stored in a memory 7. This memory 7 stores the magnitude of the signal outputted from each comparator, in a manner to correspond to each of SQUID 1 to SQUID n. The signals stored in the memory 7 are fed back on the basis of their magnitudes to the individual SQUIDS through feedback means 42 using the superconducting loop, and the demultiplexer 9.

This superconducting loop is constructed to include a Josephson junction element or a Josephson quantum interference device. The control through the feedback means is carried out by storing the magnetic flux in the superconducting loop in response to the output signal coming from the memory 7 and by coupling the magnetic flux to the SQUID 1 to SQUID n. The demultiplexer 9 is a switch which was constructed by arranging a plurality of Josephson quantum interference devices, so that the signals from the feedback means 42 could be switched to be fed back only to a desired SQUID by controlling the maximum superconducting current of the Josephson quantum interference devices.

Figure 16:
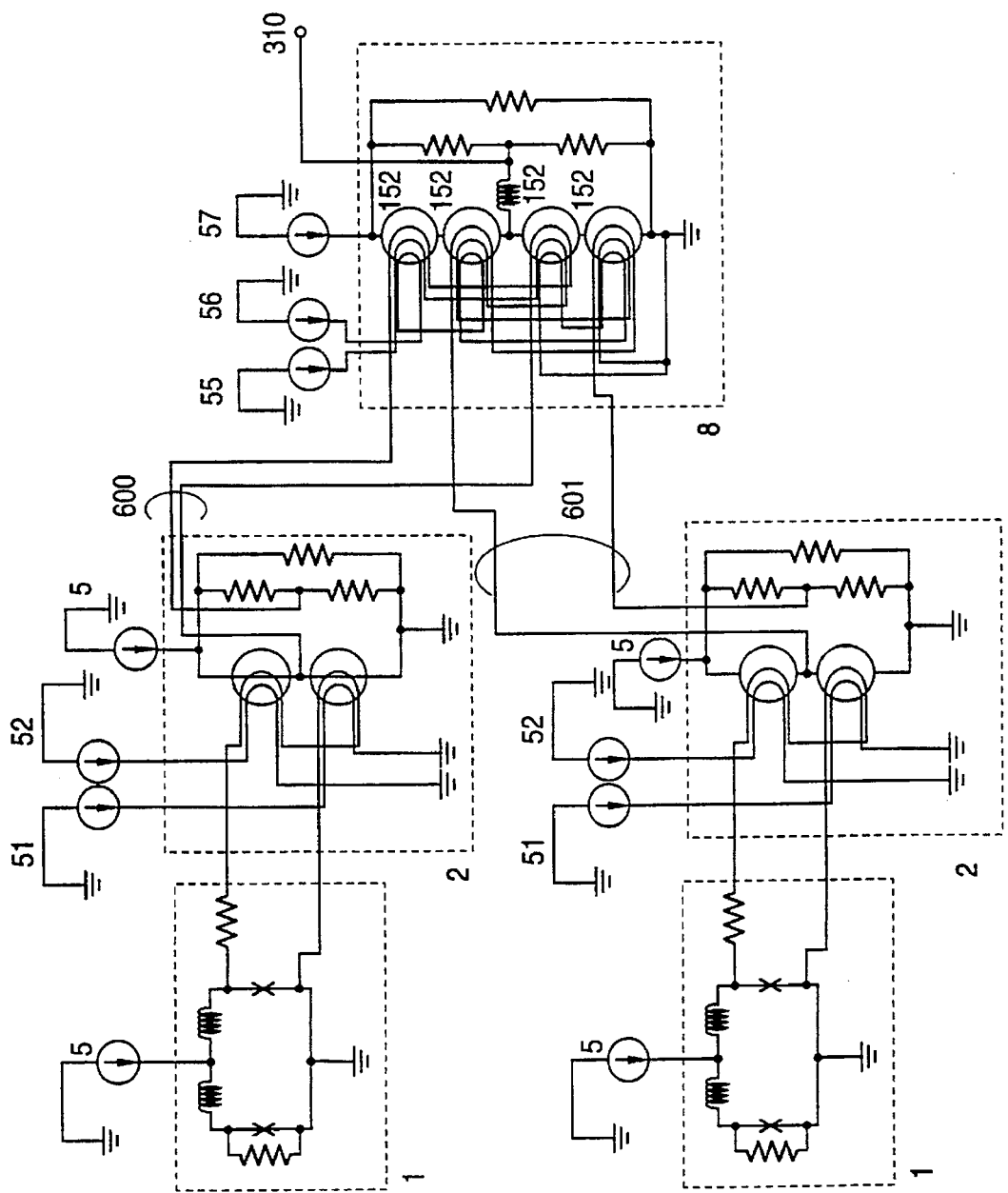
FIG. 16 is a circuit diagram of another embodiment of the present invention, in which a multiplexer powered by a DC current source is used.

FIG. 16 is a circuit diagram showing the SQUIDs 1, the comparators 2 and the multiplexer 8 for a two-channel digital SQUID magnetic flux measurement system according to this first aspect of the present invention. In the present circuit, all these components are powered by DC current sources. Although not shown, the readout circuit is also constructed of a Josephson logic circuit powered by a DC current source. The output signal from the SQUID 1 is converted by the comparator 2 into a digital signal and is inputted to the flip-flop type multiplexer 8 composed of four Josephson quantum interference devices 152. The multiplexer 8 is powered by a DC current source 57 and can output one of the two input data coming from the signal inputting wirings 600 and 601, in accordance with a select signal 55. A signal 56 is the reset means for the readout circuit. In case each of the SQUID, the comparator and the readout circuit is powered by DC current sources, as in the present embodiment, it is possible to prevent fluctuation of the ground potential and crosstalk between the wirings and to prevent noise from being caused by resetting the comparator. As a result, it is further possible to reduce the noise and widen the band of the SQUID magnetic flux meter.

Figure 17:
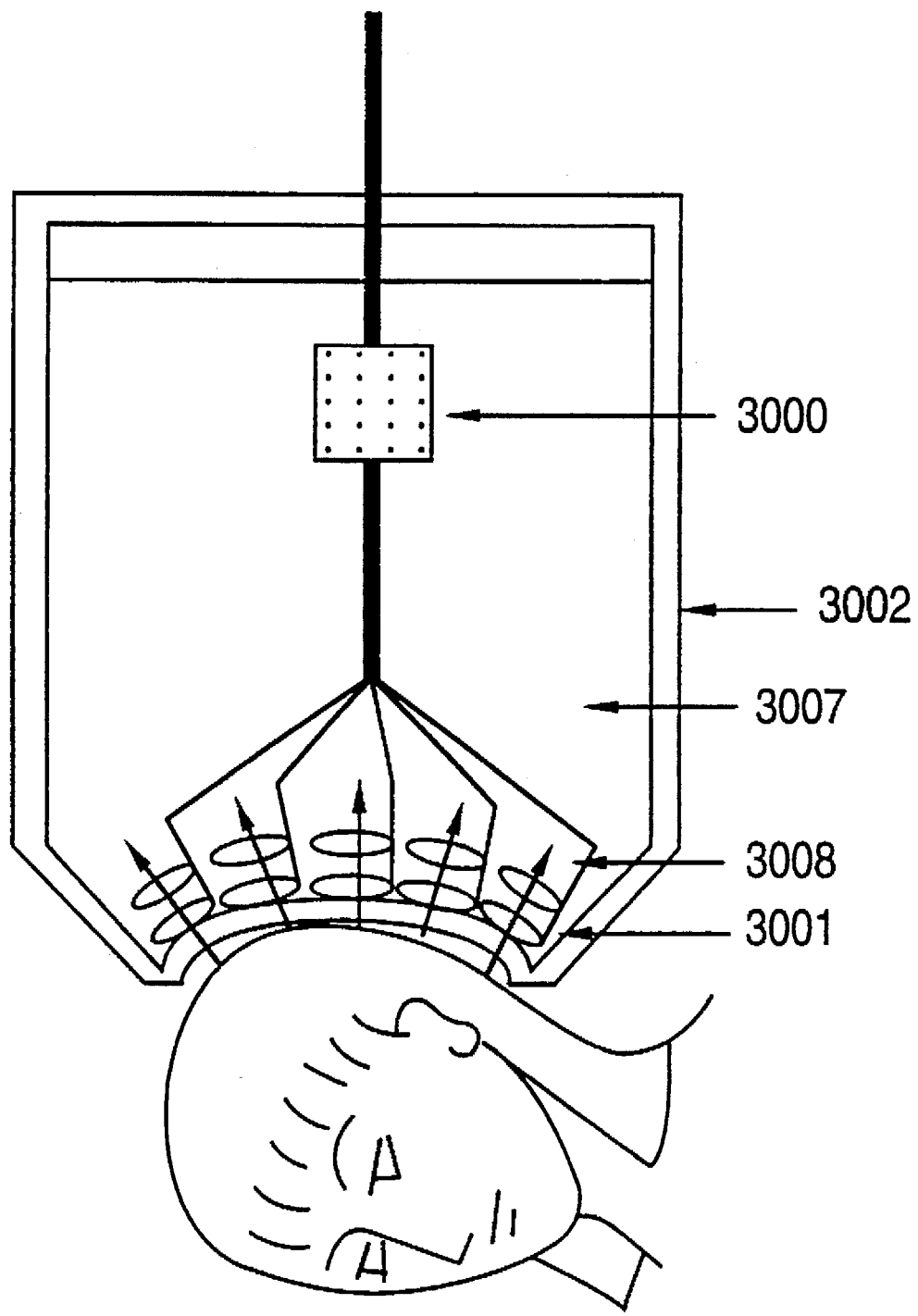
FIG. 17 is a schematic showing a brain magnetic field measurement device according to the present invention.

In case, on the other-hand, a measurement system of two or more channels is to be constructed, it is sufficient to build up the multiplexers at a necessary number of steps. This measurement system of two or more channels is exemplified in FIG. 17 by the digital SQUID measurement system according t the present invention. In this example, a magnetic flux 3008 to be established from a brain is measured. A detecting coil 3001 and a digital SQUID chip 3000 are disposed in a heat-shielded apparatus 3002 made of a resin and confining liquid helium 3007. In the digital SQUID chip 3000, although not shown, the SQUID, the Comparator and the readout circuit are monolithically integrated for a plurality of channels. In this case, too, all the signals can be digitally stored, and the measurement sensitivity is excellent to provide an effect that signals from the brain can be detected highly accurately.

Embodiment 6

Figure 18:
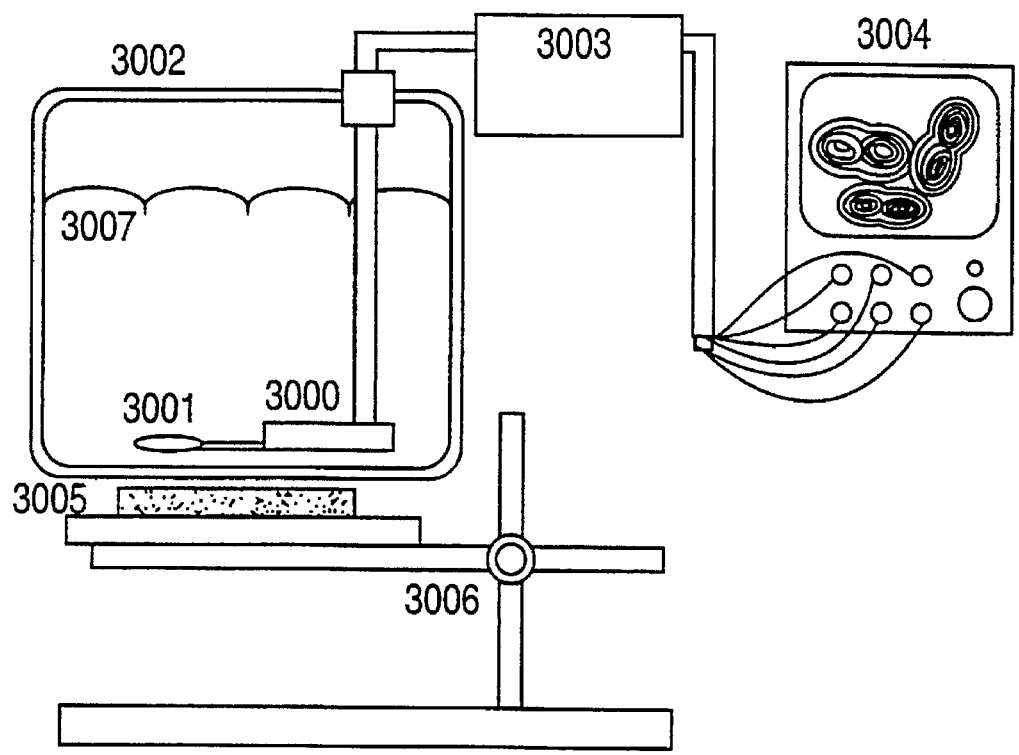
FIG. 18 is a schematic showing a SQUID microscope according to the present invention.

FIG. 18 shows a construction of a SQUID microscope or a device for measuring the magnetic distribution of a sample magnetized with a small amplitude. In the heat insulated apparatus 3002 made of a resin and confining liquid helium 3007, there are disposed detecting coil 3001 and digital SQUID chip 3000. In this digital SQUID chip 3000, there are monolithically integrated the comparator and the readout circuit, although not shown. A sample 3005 magnetized with a distribution is placed on a moving platform 3006 also made of a resin. This moving platform 3006 can move two-dimensionally in a plane.

The magnetic flux from the sample 3005 is measured while moving the moving platform 3006 little by little. The digital signals from the digital SQUID chip 3000 are stored in a relay circuit 3003 placed at room temperature and displayed as an image on a display device 3004. As a result, the two-dimensional distribution of the magnetic flux of the sample 3005 can be measured. In the present embodiment, the moving platform 3006 is disposed close to the bottom of the heat-shielded apparatus 3002 but may naturally be disposed in the heat-shielded apparatus. The digital SQUID measurement system of the preset embodiment can be used in a nondestructive investigation of a material, for example. In this case, too, all the signals can be digitally stored, and the measurement sensitivity is excellent to provide an effect that a defect of the material such as cracking or corrosion can be highly accurately detected.

Embodiment 7

Figure 19:
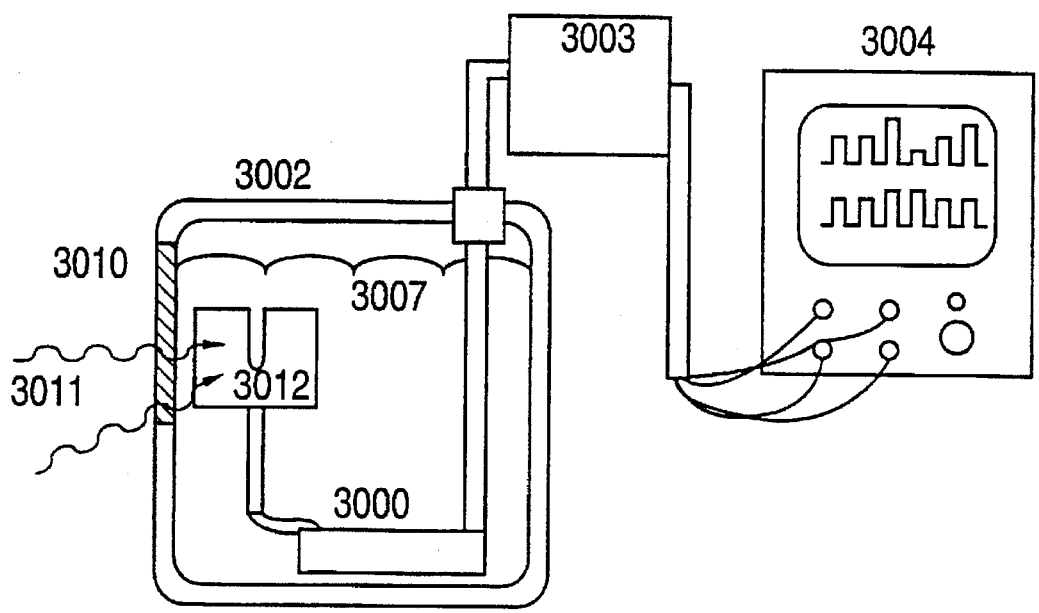
FIG. 19 is a schematic showing a high frequency magnetic field detecting device according to the present invention.
Figure 20:
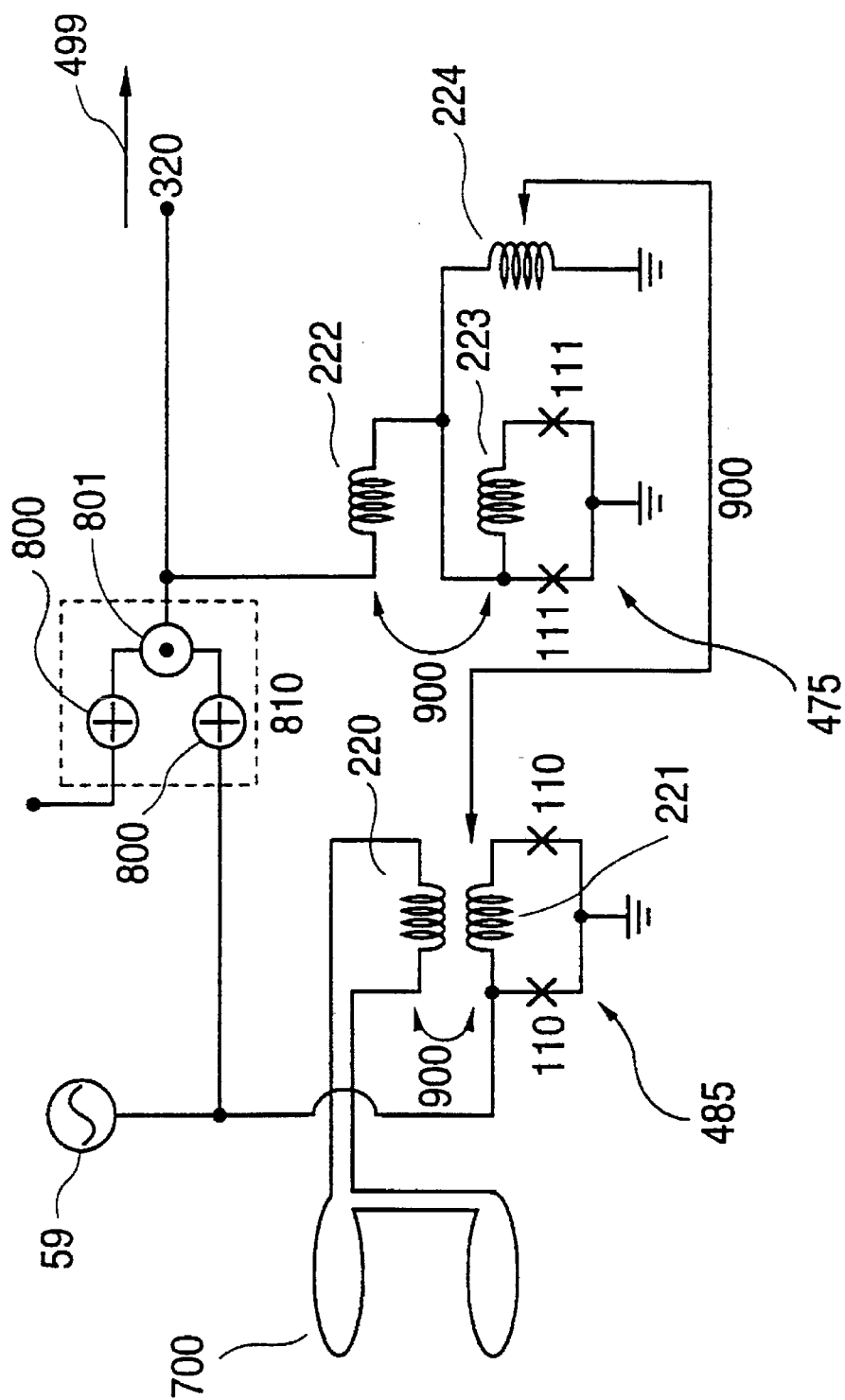
FIG. 20 is a circuit diagram showing a digital SQUID of the prior art, having a SQUID powered by an AC current source.

FIG. 19 shows a construction of a digital SQUID measurement system according to another embodiment of this aspect of the present invention. In this embodiment, the heat-insulated apparatus 3002 is equipped at its wall portion with an aperture 3010 made of quartz, through which a high-frequency electromagnetic signal 3011 is incident and received by an antenna so that the signal is guided into the digital SQUID chip 3000. In this digital SQUID chip 3000, there are monolithically integrated the SQUID, the comparator and the readout circuit, although not shown. The digital signals from the digital SQUID chip 3000 are stored in the relay circuit 3003 placed at room temperature so that they are displayed in the display device 3004. As a result, the high frequency electromagnetic signal 3011 can be detected with high sensitivity. The digital SQUID measurement system of the present embodiment can be used to detect a high-frequency signal with small amplitude, for example. In this case, too, all the signals can be digitally stored and measured with a high sensitivity to provide an effect that the signals can be detected highly accurately. In the present embodiment, the signals are received by using the antenna 3012. If, however, this antenna 3012 is replaced by a bolometer, a signal with small amplitude in the infrared range can be detected with high sensitivity.

Embodiment 8

Figure 21:
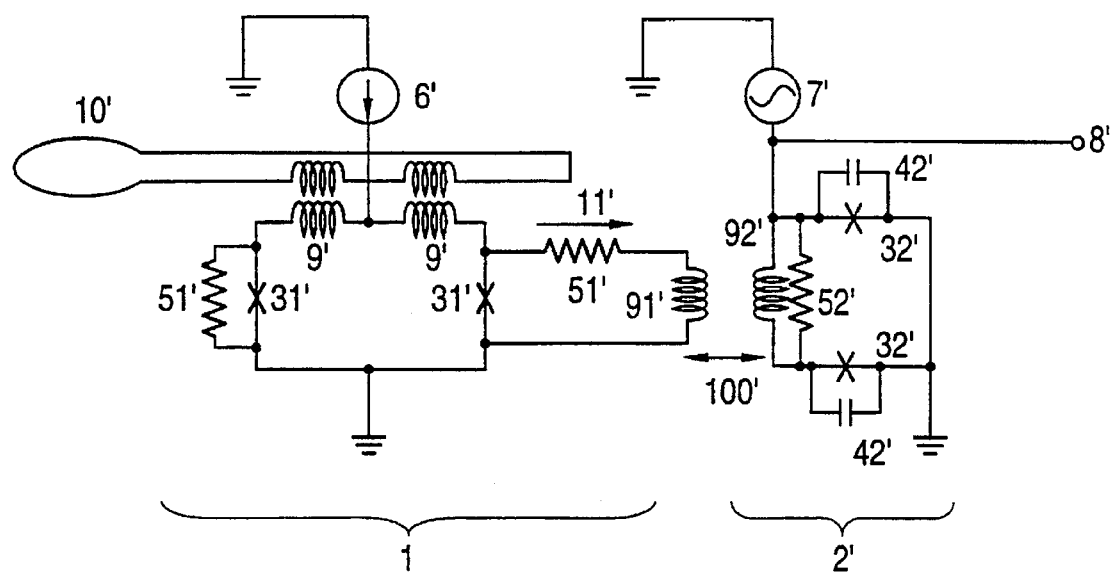
FIG. 21 is a circuit diagram showing another embodiment of the present invention.

FIG. 21 is a circuit diagram showing an embodiment according to the second aspect of the present invention. In the present embodiment, a SQUID 1 is used as the sensor. A comparator 2' is powered by an AC current source 7' and is composed of: an inductance 92' made of a superconductive element; a resistor 52' connected in parallel with the inductance 92'; a Josephson junction 32'; and a capacitor 42' connected in parallel with the Josephson junction 32'. The SQUID 1 is powered by a DC current source 6'. The change in the output voltage, which is established by inputting a magnetic flux to the SQUID 1 by magnetic flux input means 10', is converted into a magnetic flux signal by a shunt resistor 51' and an inductance 91' of the SQUID 1 and is inputted to the comparator 2' by a magnetic coupling 100'. By the input signal, the comparator 2' is changed from the superconducting state to the voltage state to convert the analog signal of the SQUID 1 into a digital signal.

In the present embodiment, if the SQUID 1 has its bias current so set that its output voltage changed from about 10 μV in response to a change in the input magnetic flux from $n\Phi_o$ to $(n+0.5)\Phi_o$, an output signal current 11' of about 3 μA to 20 μA is caused to flow through the inductance 91' by the shunt resistor 51' of 3 Ω. Through the magnetic coupling 100', about 70% of the signal is transmitted from the inductance 91' to the inductance 92' so that a current of about 2 μA to 14 μA flows to the comparator 2'.

In case the critical current (Im) is set to 350 μA and in case the bias current (Ib) of the comparator 2' is set to 347 μA while considering the value of the output signal current 11' from the SQUID 1, the sum (Ig) of the current to be injected into the comparator 2' ranges from 349 μA to 361 μA, if the output signal current 11' from the SQUID 1 is injected into the comparator 2'. If the sum exceeds 350 μA, the comparator 2' switches to the voltage state. On the other hand, the comparator 2' has a Josephson junction 32' of about 0.6 pF and an inductance of 3 pH. The present embodiment is so designed (1) that the current noise due to the Josephson oscillation generated by the SQUID 1 may be eliminated by a turn-on delay; and (2) that the LC resonance due to the inductance 92' of the comparator 2' and the electrostatic capacitances of the Josephson junction 32' and the capacitor, 42' may not be lower than the frequency of the Josephson oscillation at the operating time of the SQUID. The operating voltage range of the SQUID 1 may be set to avoid the voltage corresponding to the frequency of the LC resonance, i.e., to satisfy the Formula 3 or the Formula 4. The more desirable ranges are specified in the following Formulae:

$$V < \frac{\Phi_o}{4\pi\sqrt{\frac{LC}{2}}}.$$ (Formula 6)

$$V > \frac{\Phi_o}{\pi\sqrt{\frac{LC}{2}}}.$$ (Formula 7)

This is because in case the LC resonance is damped by using the resistor, the influence of the resonance is substantially eliminated at a voltage lower than one half or higher than two times of the resonance voltage. The voltage ranges lower than one half and higher than two times of the resonance voltage correspond to the operating ranges A and B of FIG. 2, respectively.

In order to effect operation within the range, as indicated by the operating range A, the electrostatic capacitance of the capacitor 42' was set to about 19.4 pF in the present embodiment. Moreover, the resistor 52' of 0.1 Ω was provided for damping the LC resonance due to the electrostatic capacitances due to the Josephson junction 32' and the capacitor 42'. The resistor 52' has another effect, to reduce the influence of the current noise due to the Josephson oscillation to be applied to the Josephson junction 32' because the current noise due to the Josephson oscillation is shunted to the resistor 52'.

By thus selecting the individual parameters according to the present invention, the influence of the current noise due to the Josephson oscillation to be generated by a Josephson junction 31' of the SQUID 1 could be reduced to about one twentieth by the filtering action due to the turn-on delay of the Josephson junction 32' contained in the comparator 2' and the capacitor 42' in parallel to the former. As a result, the comparator 2' could be kept from miss operation to improve the measurement accuracy of the Josephson signal detector.

Figure 23:
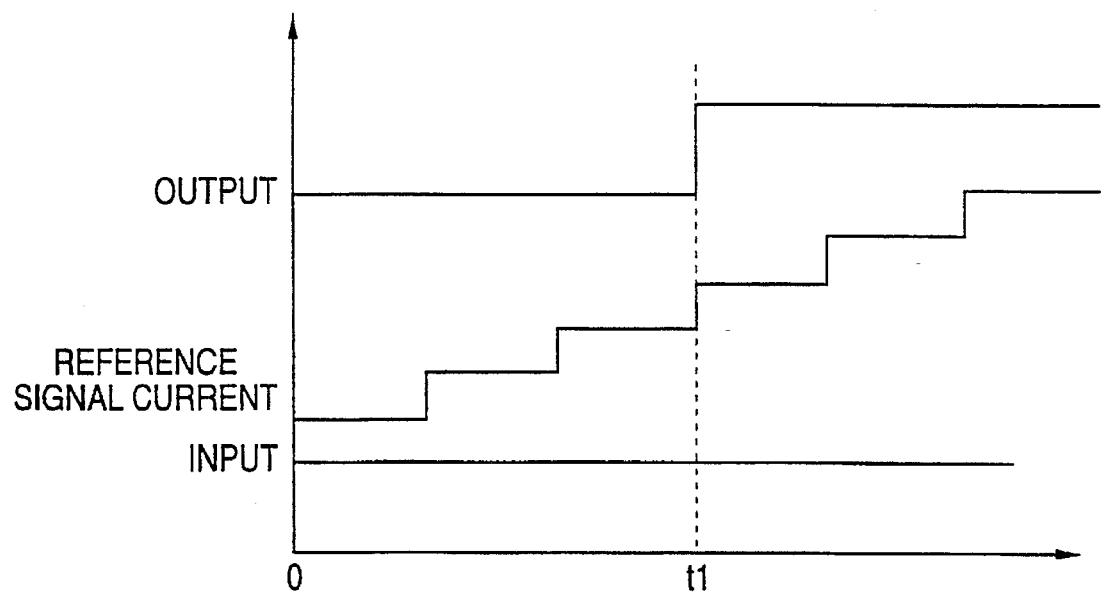
FIG. 23 shows operating waveforms for a comparator used as a sequentially approximate type analog-to-digital converter.
Figure 24:
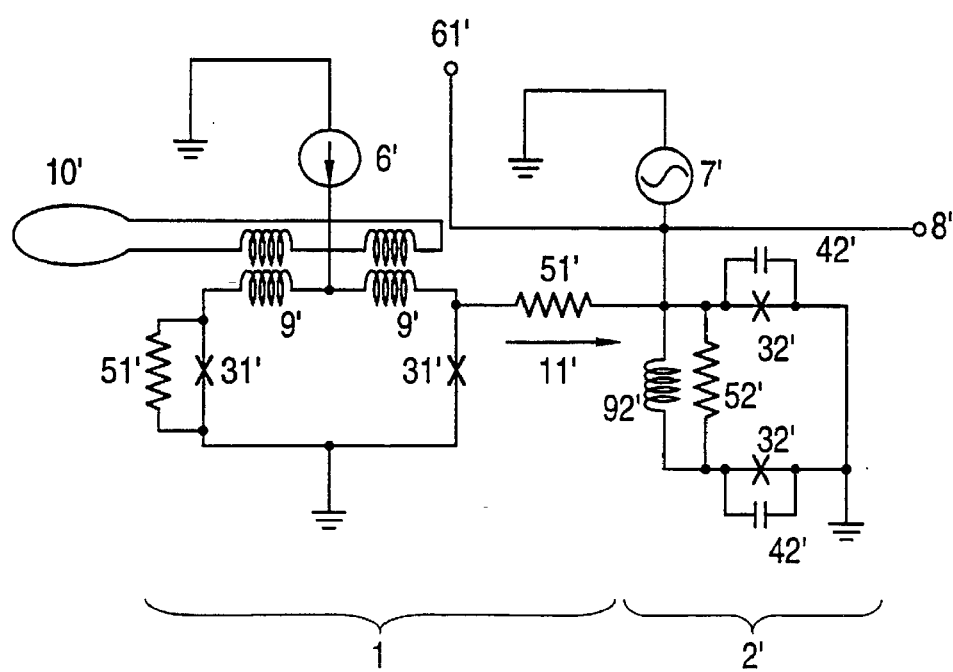
FIGS. 24 and 25 are circuit diagrams showing other embodiments of the present invention.

In the present embodiment, moreover, the influence of the current noise due to the Josephson oscillation is so low as about one twentieth, and the comparator 2' is operated with a frequency avoiding the LC resonance. As a result, a relation between the minimum current necessary for the comparator 2' from the superconducting state to the normally conducting state and the value of the signal current coming from the SQUID 1,. i.e., the magnitude of the signal inputted to the SQUID 1, becomes proportional. As a result, if the bias current source of the comparator 2' is exemplified by not only the AC current source 7' but also a current source having a stepwise variable current source, as indicated as a reference signal current in FIG. 23, the comparator 2' can be utilized as a sequentially approximate type analog-to-digital converter by determining the bias current flowing through the comparator 2' from the instant (e.g., $t_1$ in FIG. 23) at which the comparator 2' changes into the voltage state. In this case, as shown in FIG. 24, a wiring 61' for injecting a reference signal current may be provided in addition to the AC current source 7'. In FIG. 21, the comparator 2' is of the magnetic coupling type, in which the current to flow through the resistor 51' is switched by the nagnetic flux to be generated by the inductance 91'. As shown in FIG. 24, however, a similar effect can also be achieved by using a current injection type comparator which is to be switched by the current injected through the resistor 51'.

Since, moreover, a proportional relationship is established between the minimum current necessary for the comparator 2' to change from the superconducting state to the normal conducting state and the value of the signal current from SQUID 1, i.e., the magnitude of the signal to be inputted to the SQUID 1, the FLL (i.e., Flux Locked Loop) circuit can be used as a feedback method for controlling the operation of the SQUID 1.

Figure 22:
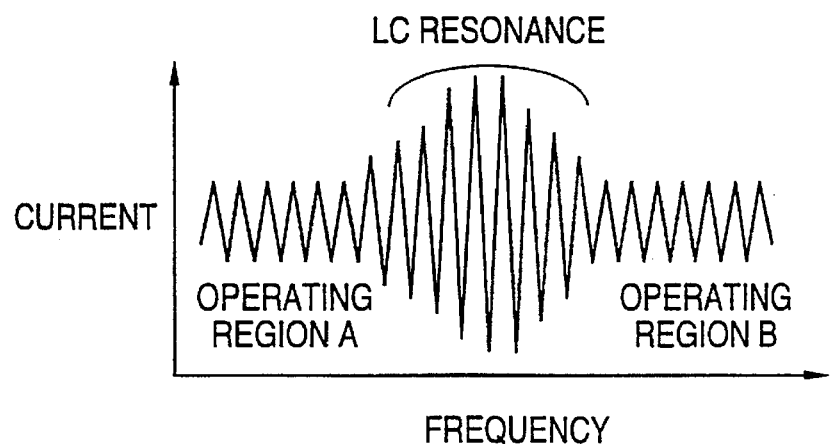
FIG. 22 is a diagram of current vs. frequency, showing operating regions of a comparator.

In the present embodiment, moreover, the comparator 2' is used to have its operating point within the range, as indicated as the operating region A in FIG. 22. In order to avoid the influence of the LC resonance, however, a similar effect can be achieved even if the operating point of the comparator 2' is within the operating range B indicated in FIG. 22.

Embodiment 9

Figure 25:
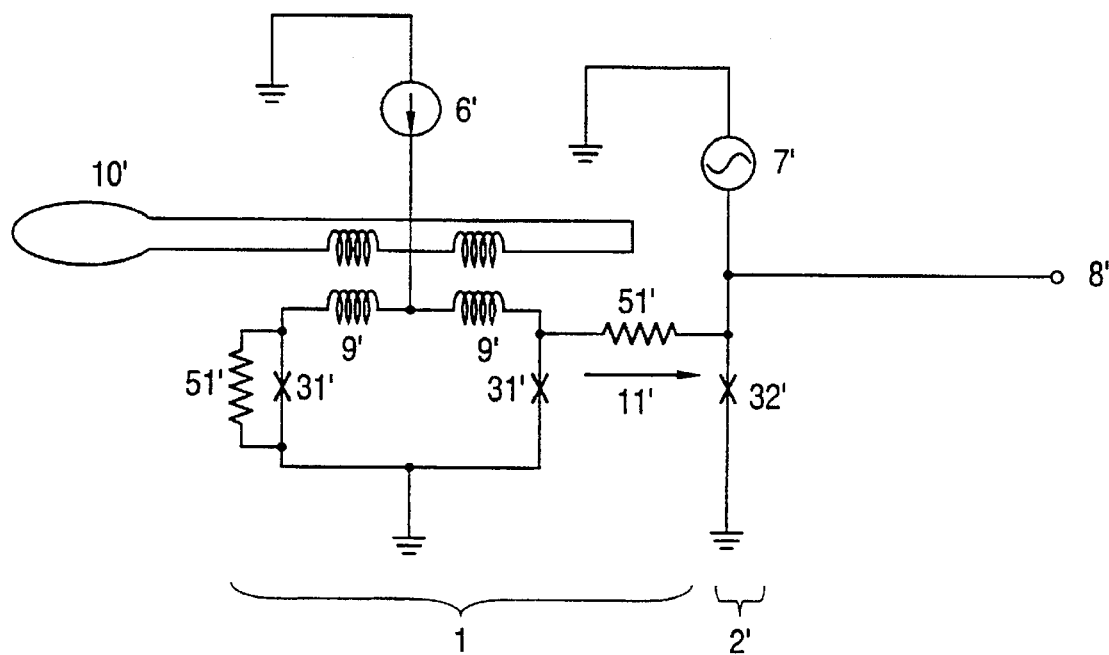

FIG. 25 is a circuit diagram showing a further embodiment according to this second aspect of the present invention. In the present embodiment, a SQUID is used as the sensor. The comparator 2 is powered by the AC current source 7' and is composed of the Josephson junction 32'. The SQUID 1 is powered by the DC current source 6', and the change in the output voltage, which is established by inputting the magnetic flux to the SQUID 1 by the magnetic flux input means 10', is directly inputted as the output signal current 11' to the comparator 2' through the shunt resistor 51'. The comparator 2' is switched to the voltage state, in case the sum of the output signal current 11' coming from the SQUID 1 and the current injected from the AC current source 7' by the AC bias exceeds the critical current of the Josephson junction 32', and otherwise holds the superconducting state to convert an analog signal into a digital signal.

In the present embodiment, the SQUID 1 and the comparator 2' were constructed, as follows, according to the present invention so that the current noise due to the Josephson oscillation to be generated from the Josephson junction 31' at the operating time of the SQUID 1 might be eliminated by the turn-on delay due to the electrostatic capacitance of the Josephson junction 32' contained in the comparator 2'. In the SQUID 1, if the bias current is so set that the output voltage may change from about 10 µV to about 60 µV in accordance with the change in the input magnetic flux from $n\Phi_o$ to $(n+0.5)\Phi_o$, the output signal current 11' of about 3 µA to 20 µA is injected into the comparator 2 by the shunt resistor 51' of 3 Ω. In case the comparator 2' has a critical current (Im) of 350 µA, the bias current (Ib) of the comparator 2' is set to 346 µA while considering the value of the output signal current 11' coming from the SQUID 1. Then, the sum (Ig) of the current to be injected into the comparator 2 ranges from 349 µA to 366 µA in case the output signal current from the SQUID 1 is injected into the comparator 2'. Under the above-specified conditions, therefore, the Josephson junction 32' had its electrostatic capacitance set to 15 pF so that the current noise due to Josephson oscillation might be eliminated by making use of the turn-on delay due to the electrostatic capacitance of the Josephson junction 32' of the comparator 2'. This Josephson junction 32' was sized to have a junction area of 10 µm square. As a result that the SQUID 1 and the comparator 2 were manufactured to have the aforementioned values, the effective magnitude of the current noise due to the Josephson oscillation to be sensed by the comparator 2' and generated by the Josephson junction 31' of the SQUID 1 could be reduced about one-tenth of that of prior devices by the turn-on delay. As a result, small change of the output signal current 11', which could not be detected in prior devices because the small change was buried in the current noise due to the Josephson oscillation, can be detected to improve the measurement accuracy and to eliminate the miss operation.

In the present embodiment, both the SQUID and the comparator are made of a superconducting element so that they can be manufactured over a common chip by the processing technology of an integrated circuit having its superconducting element made of Nb.

Embodiment 10

Figure 26:
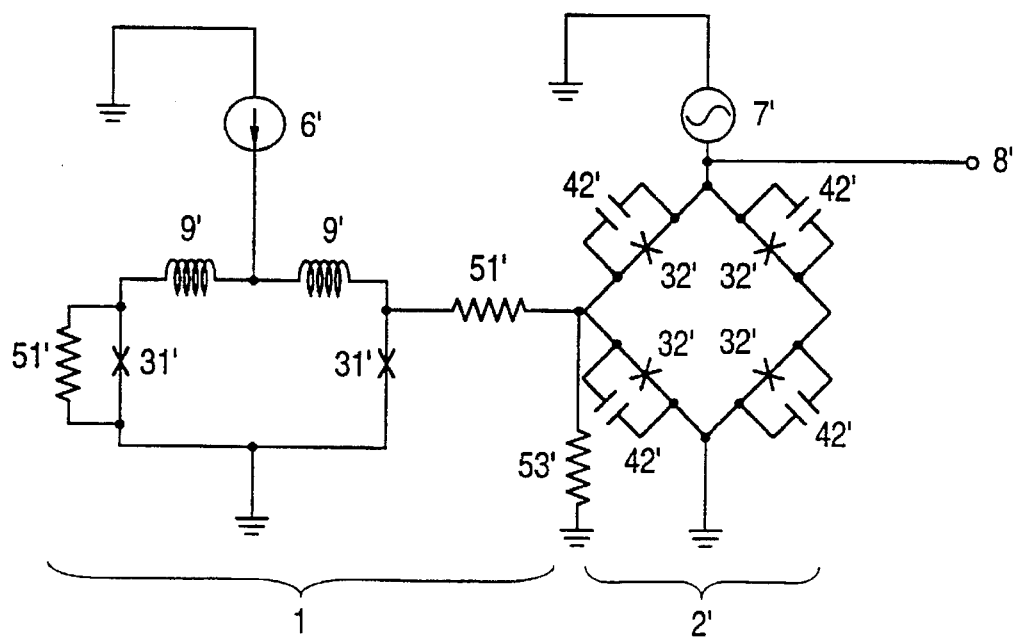
FIG. 26 is a circuit diagram showing a sensor and comparator according to the present invention, wherein an input/output separate type comparator is used.
Figure 27:
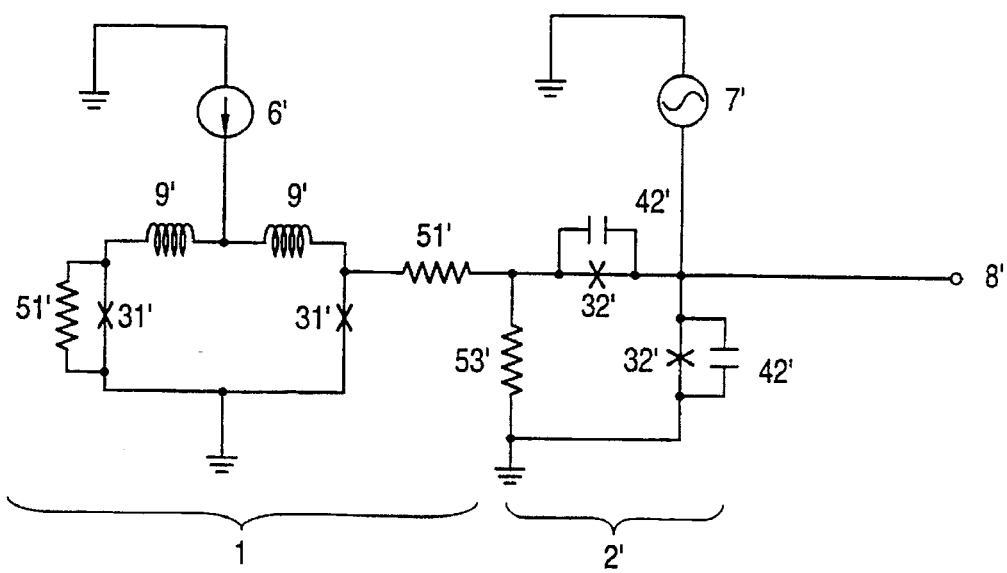
FIGS. 27 and 28 are each circuit diagrams showing a sensor and comparator according to the present invention, wherein other input/output separate type comparators are used.

FIG. 26 is a circuit diagram showing another embodiment according to this second aspect of the present invention. In the present embodiment, a SQUID is used as the sensor. The comparator 2' is of the current injection type in which it is switched by the current injected through the resistor 51'. In the present embodiment, the comparator 2' is composed: of four sets of parallel connected structures of the Josephson junction 32' and the capacitor 42'; and a resistor 53, so that it has an input/output separate-type circuit construction. As a result, current is prevented from flowing backwards from the comparator 2' to the SQUID 1 even after the comparator 2' has changed to the voltage state. Moreover, the comparator 2, as exemplified in the present embodiment, has no inductance as a component so that it is kept away from any LC resonance. As a result, the electrostatic capacitance of the capacitors 42' contained in the comparator 2' is so selected that the noise due to the Josephson oscillation, as is generated by the Josephson junctions 31' at the operating time of the SQUID 1, may be eliminated by the turn-on delay due to the Josephson junctions 32' and the capacitors 42' of the comparator 2'. Thus, it is possible to keep the comparator 2' from any miss operation and to improve the measurement accuracy.

Figure 28:
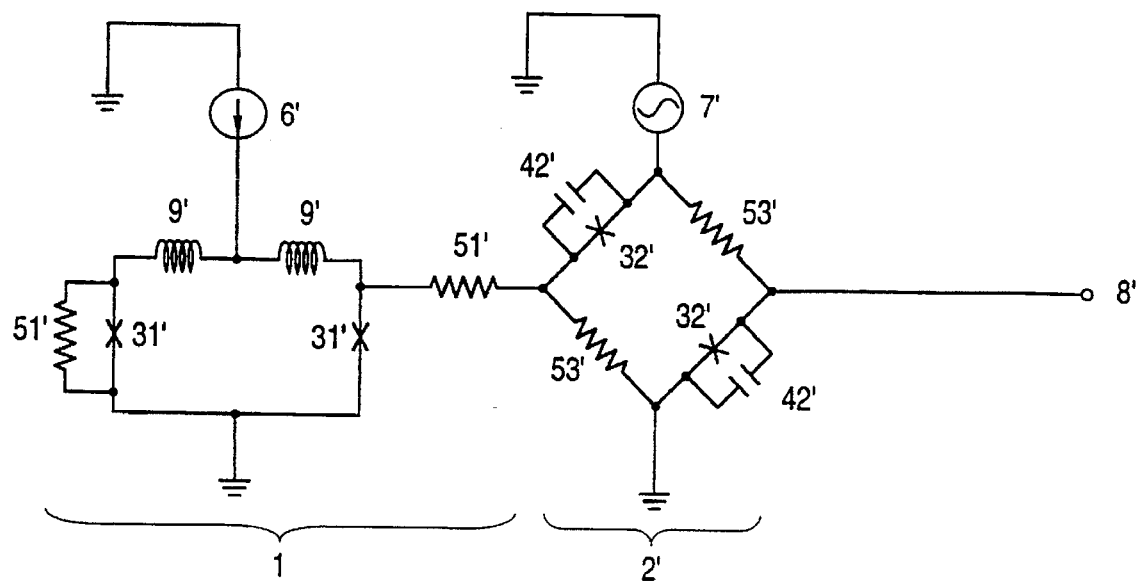

The comparator 2' in the present embodiment is exemplified by an input/output separate circuit which is constructed of four sets of parallel connected structures each composed of the Josephson junction 32' and the capacitor 42', and the resistor 53'. However, the structure of the input/output separate circuit should not be limited thereto. This structure may naturally be exemplified by either the JAWS (i.e., Josephson Atto Weber Switch) type which is constructed of two sets of parallel connected structures each composed of the Josephson junction 32' and the capacitor 42', and the resistor 53', as shown in FIG. 22, or the DCL (i.e. Direct Coupled Logic) type which is constructed of two sets of parallel connected structures each composed of the Josephson junction 32' and the capacitor 42' and the two resistors 53', as shown in FIG. 28.

Embodiment 11

Figure 29A:
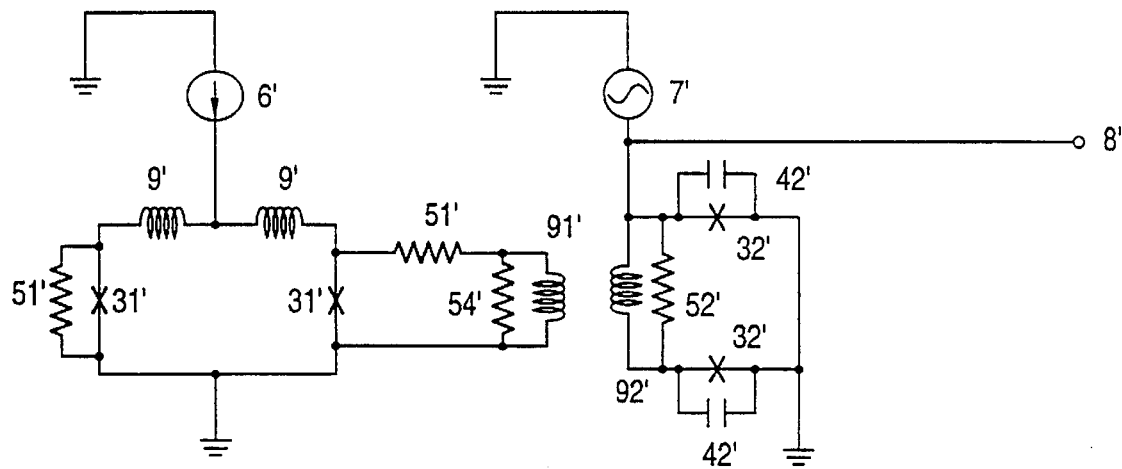
FIGS. 29a, 29b and 29c are circuit diagrams of a device according to the present invention, having a plurality of SQUIDs and comparators.
Figure 29B:
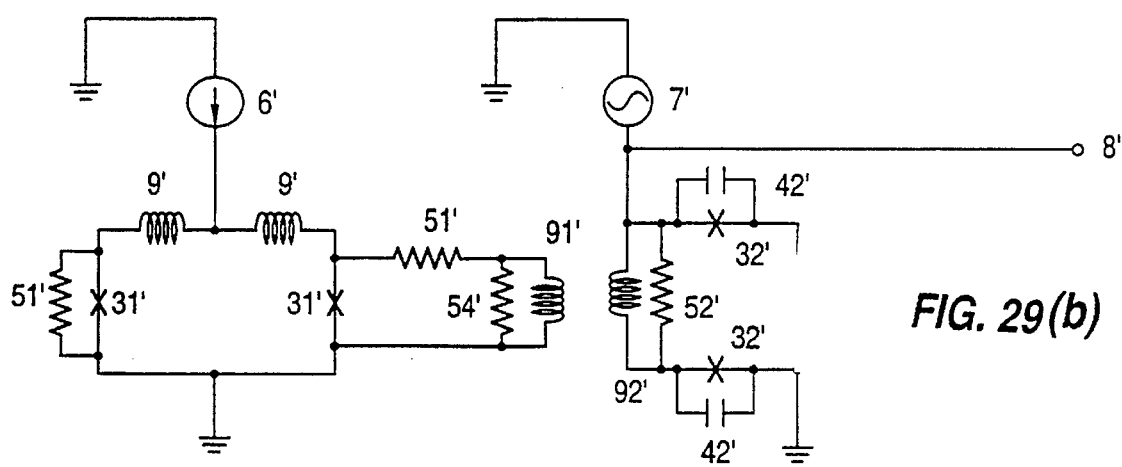
Figure 29:
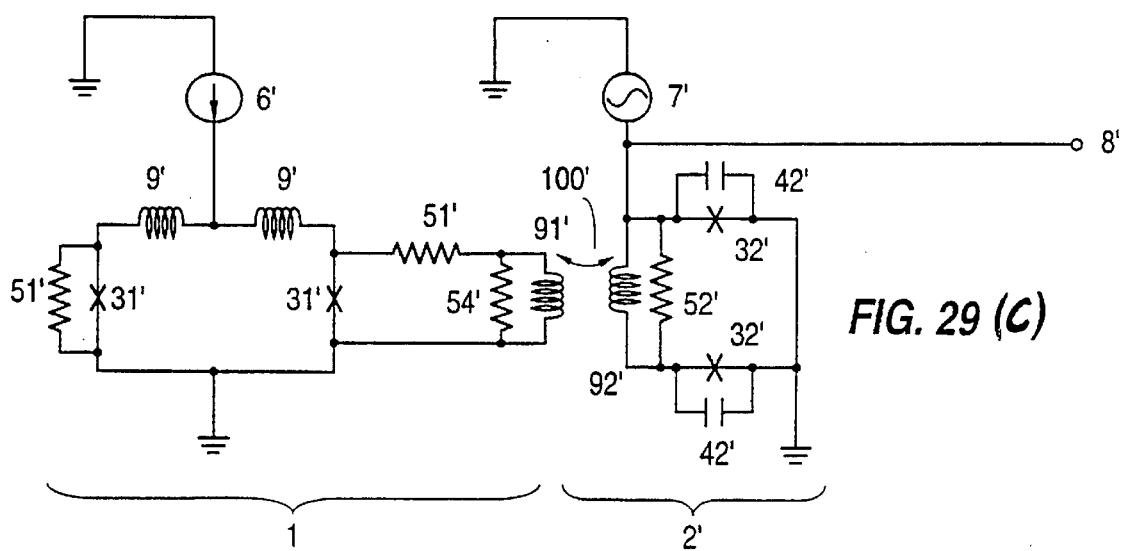

FIG. 29 is a circuit diagram showing another embodiment according to this second aspect of the present invention. This embodiment is equipped with a plurality of Josephson signal detectors each having a combination of the SQUID 1 and the comparator 21', as shown in FIG. 29, so that it can measure the changes in the input magnetic fluxes simultaneously at a plurality of locations. In the present embodiment, the comparator 2' is of the magnetic coupling type, in which the current to flow through the resistor 51' is switched by the magnetic flux generated by the inductance 91'. Thus, the comparator 2' is composed of: an inductance 92' made of a superconducting element; a resistor 52' connected in parallel with the inductance 92'; the Josephson junction 32'; and the capacitor 42' connected in parallel with the Josephson junction 32'. Thanks to this construction and by selecting the individual parameters, as exemplified in Embodiment 8 and Embodiment 9, it is possible to keep the comparator 2' from any miss operation and to improve the measurement accuracy.

In the present embodiment, moreover, the SQUID 1 is provided with a resistor 54' in parallel with the inductance 91' for inputting a signal to the comparator 2' by magnetic coupling. Thanks to the provision of the resistor 54', it is possible to damp the LC resonance due to the electrostatic capacitance of the Josephson junction 31' of the SQUID 1 and the inductance 91'. Moreover, the current noise due to the Josephson oscillation generated by the Josephson junction 31' can be shunted to the resistor 54', thereby to reduce the current noise to be magnetically coupled to the comparator 2'. According to the construction of the present embodiment, therefore, the current noise due to the Josephson oscillation can be further reduced to improve the measurement accuracy.

Embodiment 12

Figure 30:
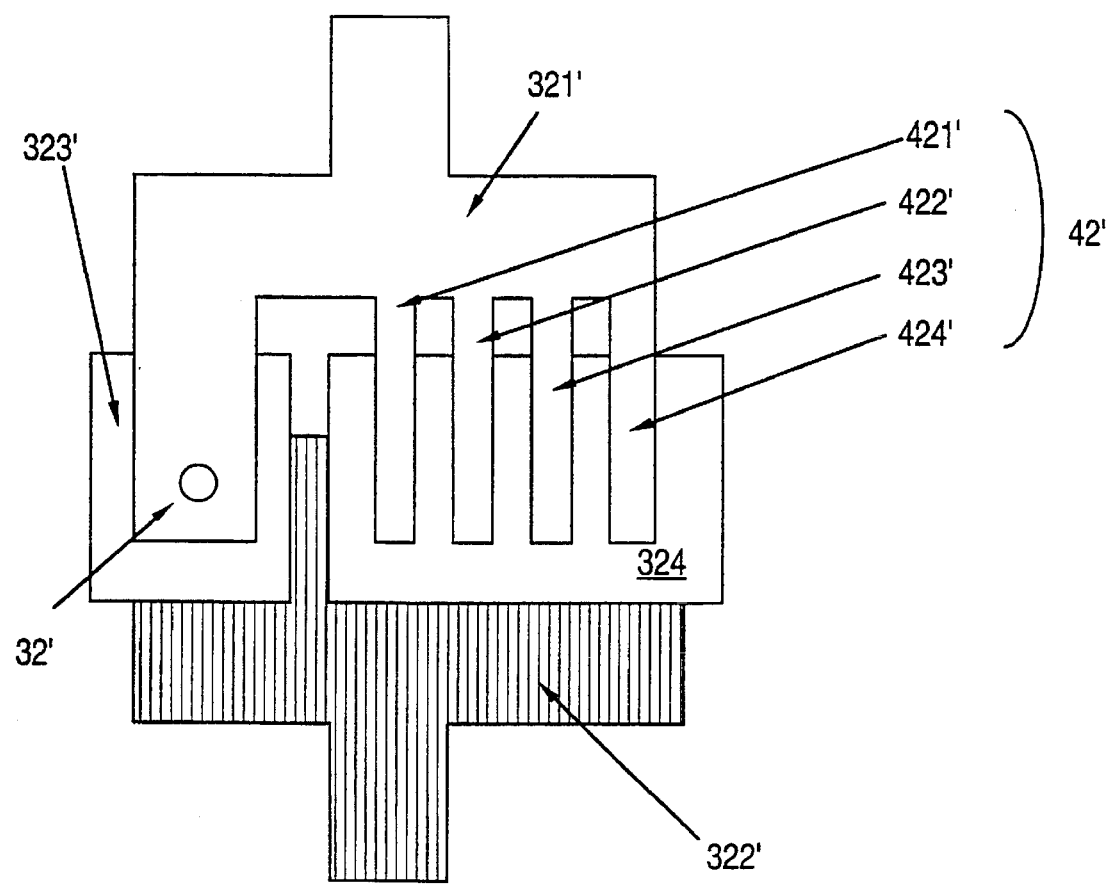
FIG. 30 is a top plan view showing a Josephson junction and shapes of a capacitor having four divided capacitor portions.

FIG. 30 is a top plan view showing the shape of the Josephson junction 32' of the comparator 2' according to another embodiment of this second aspect of the present invention, as well as the capacitor 42' arranged in parallel with the Josephson junction 32'. This capacitor 42' is composed of four capacitor portions 421', 422', 423' and 424', and the two superconducting films forming the upper electrode 321' and the lower electrode 322' of the Josephson junction 32' are provided as the electrodes of those capacitor portions 421' to 424'.

In the present embodiment, the Josephson junction 32' has its upper and lower electrodes 321' and 322' made of Nb and its tunnel barrier layer 323' made of $AlO_{x(e.g. AlO_2)}$.) The electrodes forming the capacitor 42' are made of the same thin film as that of the electrodes composing the Josephson junction 32'. In case, on the other hand, the capacitor 42' is constructed by making an insulation film 324' of not $AlO_x$ but $Nb_2O_5$, $Ta_2O_5$ or $Hf_2O_5$, there arises an advantage that the capacitor portions can have their areas reduced because those substitution materials have higher specific dielectric coefficients than that of $AlO_x$.

Figure 31:
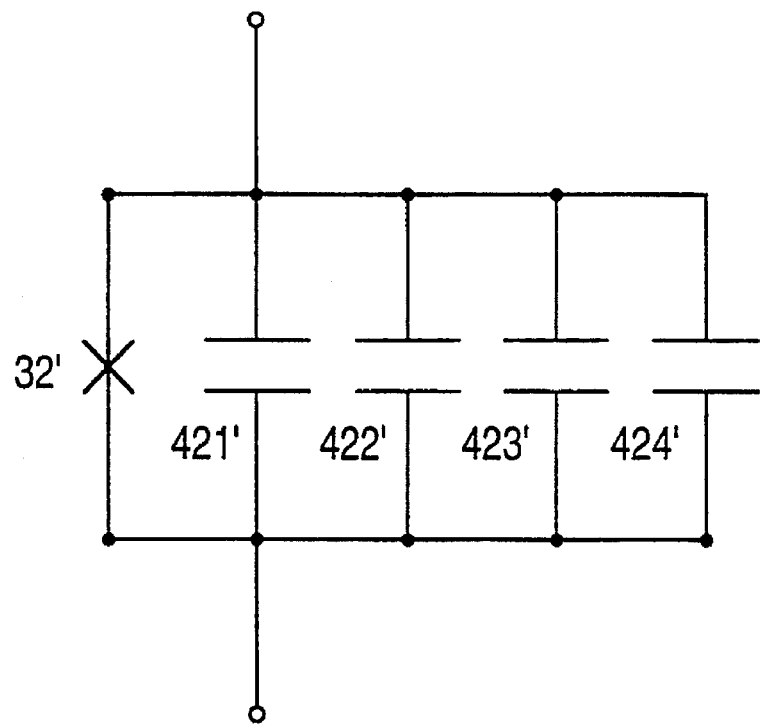
FIG. 31 is a circuit diagram of the capacitor having four divided capacitor portions, and Josephson junction, of FIG. 30.

In case, moreover, the capacitor 42' is constructed by dividing it into the four capacitor portions 421', 422', 423' and 424' as in the present embodiment, its electrostatic capacitance can be changed by cutting the upper electrode of the capacitor portion 424' by means of a laser trimmer, as shown in FIG. 31. Thanks to this construction, it is possible to easily construct such a filter using the turn-on delay as is optimum for the operation of the SQUID.

Embodiment 13

Figure 32:
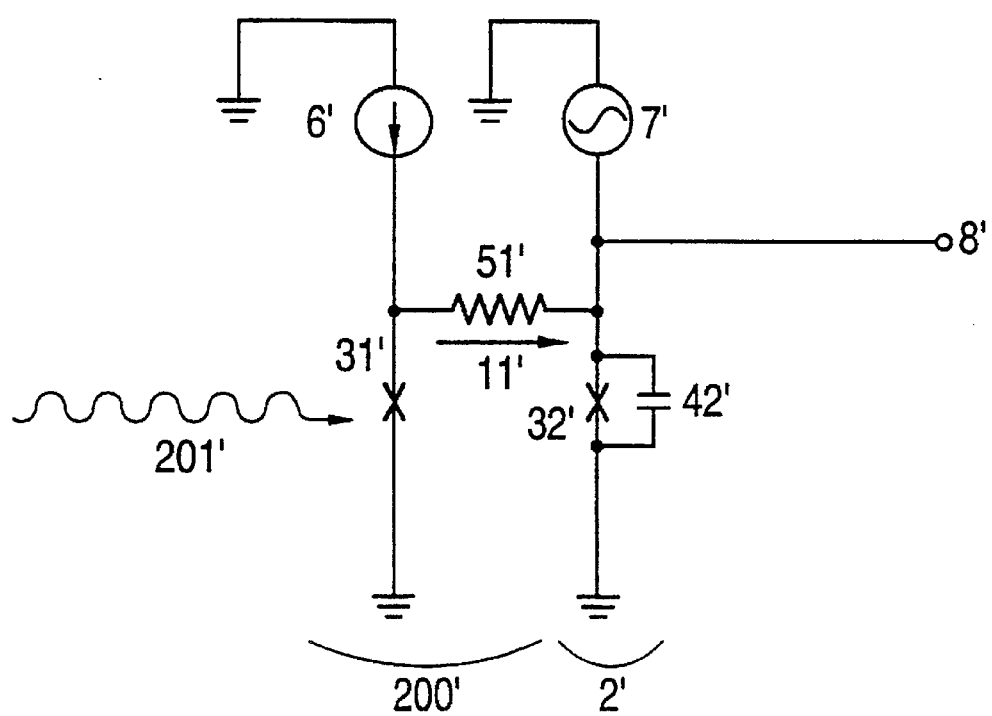
FIG. 32 is a circuit diagram showing an embodiment of the present invention for detecting X-rays and electromagnetic waves.

FIG. 32 is a circuit diagram showing another embodiment according to this second aspect of the present invention. As shown in FIG. 32, a sensor 200' is composed of the Josephson junction 31' and the resistor 51', and the Josephson junction 31' can detect X-rays and electromagnetic waves. On the other hand, the comparator 2' is composed of the Josephson junction 32' and the capacitor 42' connected in parallel with the Josephson junction 32'. Unlike the other embodiments of this aspect of the present invention, the sensor is not a SQUID, but the capacitor 42' is connected in parallel with the Josephson junction 32' composing the comparator so that the influences of the current noise to be generated from the Josephson junction 31' contained in the sensor 200' can be reduced, to detect X-rays and electromagnetic waves highly accurately.

Figure 33:
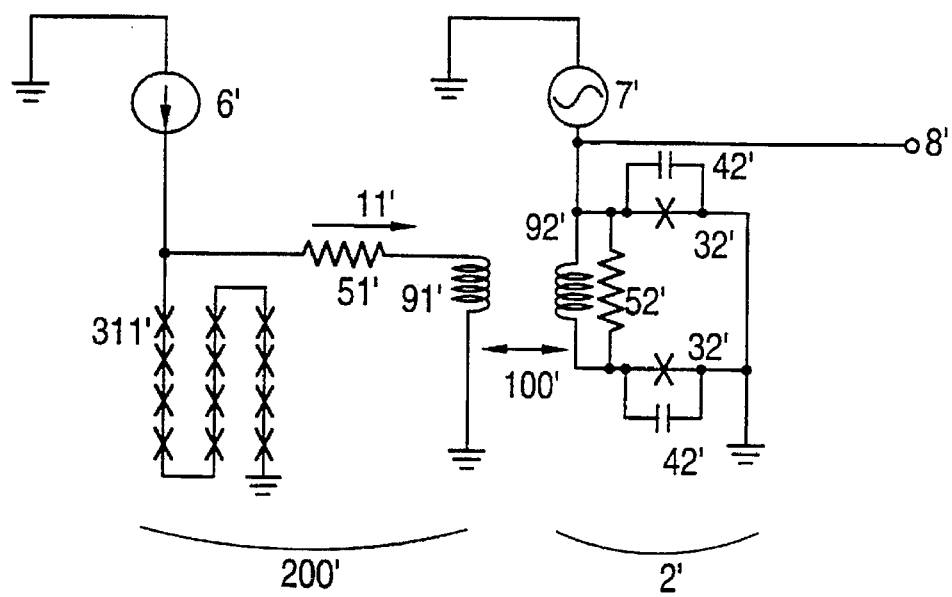
FIG. 33 is a circuit diagram showing another embodiment of the present invention for detecting X-rays and electromagnetic waves.

In the embodiment of FIG. 32, the output signal current 11' from the Josephson junction 31' at the front stage of the comparator is injected into the comparator 2'. However, the signal may be transmitted to the comparator 2' by the magnetic coupling 100' by adding the inductance 91' and the inductance 92' respectively as the components of the sensor 200' and the comparator 2' as shown in FIG. 33 In FIG. 33, the comparator is constructed of a Josephson quantum interference device. On the other hand, the sensor 200' is constructed to have an array in which two or more Josephson junctions are connected in series. Thanks to these constructions, there arises an advantage that the detection area for detecting X-rays and electromagnetic waves with small magnitudes can be enlarged without increasing the electrostatic capacity of the detector.

In the circuit construction shown in FIG. 33, the effects of the present invention can be achieved to realize a highly accurate comparator having stable operations, by eliminating the current noise due to the Josephson oscillation, as is generated by a Josephson junction array 311', by the turn-on delay, and by making the LC resonance due to the Josephson junction 32' and the capacitor 42' different from the frequency of the Josephson oscillation which is generated when the Josephson junction array 311' changes to the voltage state. Moreover, the resistor 52', provided for damping the LC resonance due to the inductance 92' and Josephson junction 32' of the comparator 2', and the electrostatic capacitance of the capacitor 42', are effective to reduce the influences of the current noise due to the Josephson oscillation to be fed to the Josephson junction 32', because not only the damping of the LC resonance but also the current noise due to the Josephson oscillation is shunted to the resistor 52'. Thanks to the provision of the resistor 52', the accuracy of the comparator can be better improved.

Embodiment 14

Figure 34:
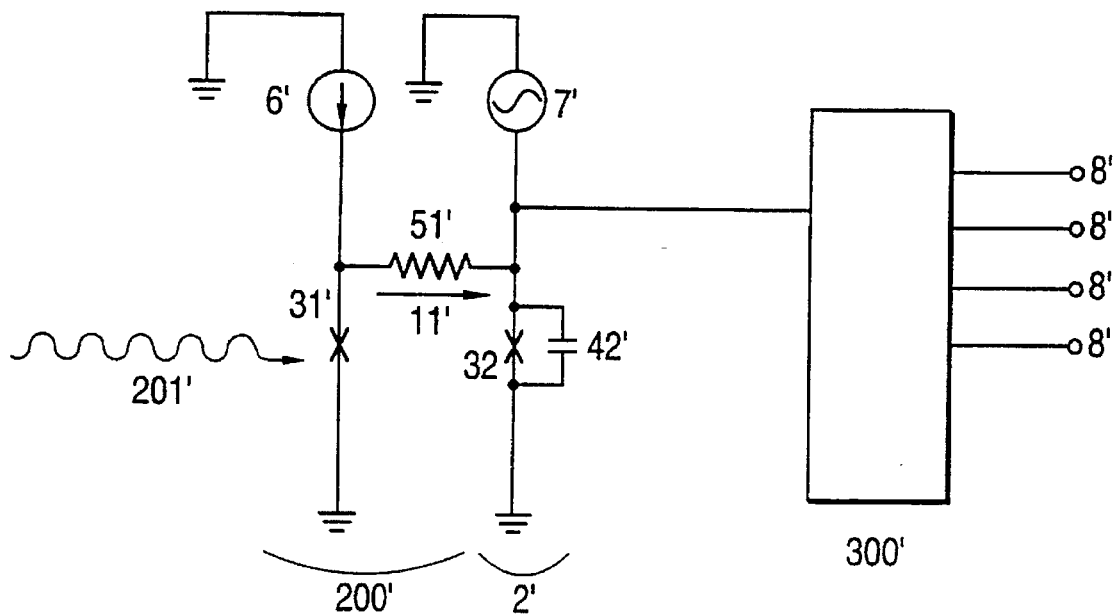
FIG. 34 is a circuit diagram showing an embodiment of the present invention having a Josephson counter for detecting X-rays and electromagnetic waves.
Figure 35:
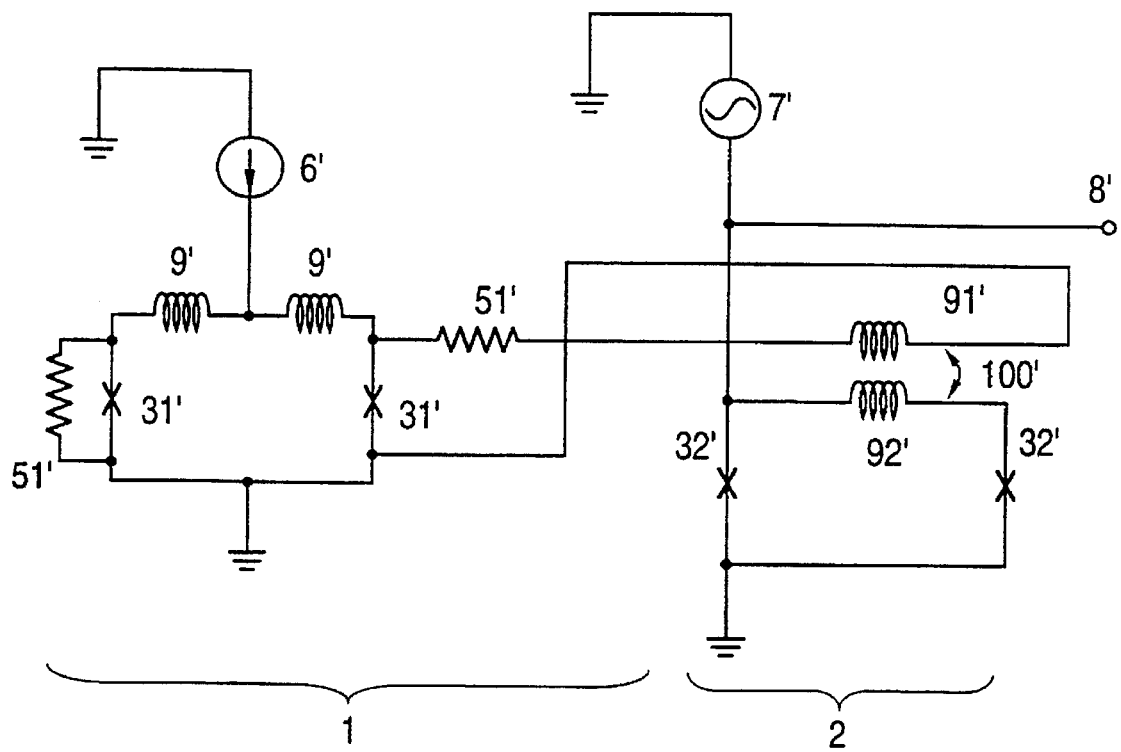
FIG. 35 is a circuit diagram of a digital SQUID for purposes of explanation.
Figure 36:
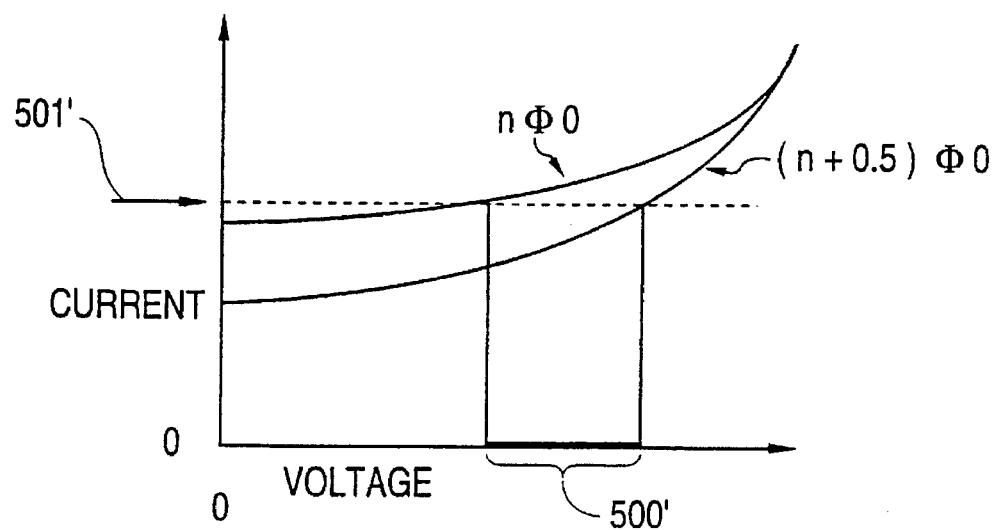
FIG. 36 is a diagram of current-voltage characteristics of a SQUID.

FIG. 34 is a circuit diagram showing another embodiment according to this aspect of the present invention. In FIG. 34, a Josephson counter 300' is arranged at the next stage of the Josephson signal detector having the construction shown in FIG. 32. By thus constructing the counter circuit of the circuit using the Josephson junction, the counter circuit can be disposed together with comparator 2' and so on in a cryogenic chamber so that the measurement device can have a small size. Since, moreover, the measurement results of the X-rays and the electromagnetic waves can be processed in the cryogenic chamber, it is possible to cope with higher counting operations than those of the case in which the counter circuit is placed at room temperature, and to prevent invasion of noise, thereby to better improve measurement accuracy.

As has been described in detail hereinbefore, the digital SQUID is constructed such that the SQUID powered by the DC current source and the comparator powered by the AC or DC current source are combined to digitize the output signals so that the signals may be read out by the readout circuit powered by the DC current source. The miss operation of the circuit due to the reflection of high-frequency waves, and the increase in noise due to crosstalk and fluctuation of the ground potential, can be prevented to provide a digital SQUID having a low noise and a high accuracy, and a measurement system using the digital SQUID.

As has been detailed hereinbefore, a Josephson signal detector according to this second aspect of the present invention comprises: a sensor constructed to include at least one Josephson junction; and a comparator constructed to include at least one Josephson junction and capable of discriminating the output voltage or output current of said sensor, wherein the Josephson oscillation generated by the Josephson junction of said sensor at the operating time of said sensor has a higher frequency than that corresponding to the turn-on delay of the Josephson junction of said comparator. Thus, it is possible to provide a Josephson signal detector which has a high measurement accuracy and which is excellent in its operating stability.

While we have shown and described several embodiments in accordance with the present invention, it is understood that the same is not limited thereto, but is susceptible to numerous changes and modifications as known to one having ordinary skill in the art, and we therefore do not wish to be limited to the details shown and described herein, but intend to cover all such modifications as are encompassed by the scope of the appended claims.

We claim:

1. A Josephson signal detector, comprising:
   a sensor including at least one Josephson junction;
   a comparator including Josephson junctions, for recognizing a magnitude of output voltage or output current of the sensor, so as to provide an output of the comparator;
   a readout circuit including Josephson junctions, for reading out the output of the comparator; and
   DC current sources, wherein the sensor, the comparator and the readout circuit are connected to the DC current sources so as to be powered substantially only by DC current.

2. The Josephson signal detector according to claim 1, wherein the sensor is a superconducting quantum interference device, having two Josephson junctions and a superconducting ring arranged to connect the two Josephson junctions.

3. The Josephson signal detector according to claim 1, wherein the comparator includes circuitry for converting an analog signal from the sensor to a digital signal as the output of the comparator.

4. The Josephson signal detector according to claim 1, further comprising an input circuit for inputting a magnetic flux to said sensor.

5. The Josephson signal detector according to claim 1, further comprising: a feedback circuit for feeding back a control signal to said sensor in response to an output of said readout circuit.

6. The Josephson signal detector according to claim 1, wherein said sensor, said comparator and said readout circuit are integrated overlying a common substrate.

7. The Josephson signal detector according to claim 1, wherein at least one of said comparator and said readout circuit includes a reset circuit for returning the readout circuit, which was switched according to an output signal of said sensor, to a state before being switched.

8. The Josephson signal detector according to claim 7, wherein said reset circuit is a signal generation structure for shifting the output signal of said sensor by a constant value.

9. The Josephson signal detector according to claim 8, wherein said signal generation structure is a wiring forming part of said comparator so that a current inputted to the wiring may be added to or subtracted from an output current of said sensor.

10. The Josephson signal detector according to claim 8, wherein said signal generation structure is a wiring forming part of said comparator so that a magnetic flux signal produced by a current inputted to the wiring may be added to or subtracted from a magnetic flux signal produced by an output current of said sensor.

11. The Josephson signal detector according to claim 7, wherein said reset circuit is a signal generation structure for feeding said comparator with a current of sign opposite to that of an output current of said sensor when said comparator is switched by the output signal of said sensor.

12. The Josephson signal detector according to claim 7, wherein said reset circuit is signal generation structure for shifting an output of said comparator by a constant value.

13. The Josephson signal detector according to claim 12, wherein said signal generation structure is a wiring forming part of said readout circuit so that a current inputted to the wiring may be added to or subtracted from an output current of said comparator.

14. The Josephson signal detector according to claim 12, wherein said signal generation structure is a wiring forming part of said readout circuit so that a magnetic flux signal produced by a current inputted to the wiring and applied to said readout circuit may be added to or subtracted from a magnetic flux signal produced by the output-of said comparator and applied to said readout circuit.

15. The Josephson signal detector according to claim 7, wherein said reset circuit is a signal generation structure for feeding said readout circuit with a current of a sign opposite to that of output current of said comparator when said comparator is switched by an output signal of said sensor.

16. The Josephson signal detector according to claim 2, wherein the two Josephson junctions of said superconducting quantum interference device have substantially equal critical currents, and wherein superconducting wirings disposed across an injection point of a bias current and forming said superconducting ring are made to have substantially equal inductances.

17. The Josephson signal detector according to claim 1, wherein said sensor and said comparator are provided by a single circuit.

18. The Josephson signal detector according to claim 1, wherein said comparator and said sensor are provided by separate circuits.

19. The Josephson signal detector according to claim 18, wherein a power to be supplied to said comparator is supplied from a DC current source providing a current which increases in steps.

20. The Josephson signal detector according to claim 18, wherein said comparator is at least two comparator circuits to construct an analog-to-digital converter having a resolution of at least two bits in its entirety.

21. The Josephson signal detector according to claim 1, wherein said comparator is constructed of a DC-powered flip-flop Josephson circuit containing a Josephson quantum interference device.

22. The Josephson signal detector according to claim 21, wherein said flip-flop Josephson circuit includes a circuit made by connecting a series-connected structure of at least two Josephson quantum interference devices and a series-connected structure of two load resistors in parallel, and by connecting intermediate contacts of these two series-connected structures by an inductance, and is a circuit which is operated by bringing one of said Josephson quantum interference devices into a voltage state and the other into a superconducting state in response to a signal output to said Josephson quantum interference devices of the flip-flop Josephson circuit.

23. The Josephson signal detector according to claim 21, wherein said flip-flop Josephson circuit includes a circuit made by connecting two Josephson quantum interference devices in series to form a series-connected structure and by connecting said series-connected structure with a constant voltage source, and is a circuit which is operated by bringing one of said two Josephson quantum interference devices into a voltage state and the other into a superconducting state in response to a signal input to the Josephson quantum interference devices of the flip-flop Josephson circuit.

24. The Josephson signal detector according to claim 21, wherein said flip-flop Josephson circuit includes a circuit equipped with two current paths by connecting two series-connected structures each of a Josephson quantum interference device and an inductance in parallel, and which is a circuit is operated by switching the current to either of said two current paths in response to the signal input to said Josephson quantum interference devices of the flip-flop Josephson circuit.

25. The Josephson signal detector according to claim 1, wherein said comparator is a circuit that operates by injecting an output current of said sensor into a portion of superconducting wiring constructing said comparator, a Josephson junction constructing said comparator, or a Josephson quantum interference device of the comparator.

26. The Josephson signal detector according to claim 25, further comprising a low-pass filter connected between said sensor and said comparator and including a resistor, a capacitor or an inductance.

27. The Josephson signal detector according to claim 25, further comprising isolation structure for isolating current from said comparator to the sensor after the comparator has changed to the voltage state.

28. The Josephson signal detector according to claim 27, wherein said isolation structure includes at least a Josephson junction disposed in a portion of the wiring connecting said comparator and said sensor.

29. The Josephson signal detector according to claim 1, wherein said sensor and said comparator are magnetically coupled.

30. The Josephson signal detector according to claim 29, further comprising a low-pass filter connected between an inductance portion of said sensor magnetically coupled to said comparator and a Josephson junction contained in said sensor, and composed of a resistor a capacitor or an inductance.

31. The Josephson signal detector according to claim 29, wherein an only superconducting element between said sensor and said comparator is a wiring for connecting said sensor and said comparator.

32. The Josephson signal detector according to claim 5, wherein said feedback circuit for feeding back the control signal to said sensor includes at least a superconducting loop and a Josephson junction disposed in a portion of said superconducting loop.

33. The Josephson signal detector according to claim 32, wherein said feedback circuit is a circuit constructed to feed back the control signal to said sensor by a magnetic field which is generated by a persistent current flowing through said superconducting loop constructing said feedback circuit.

34. The Josephson signal detector according to claim 5, wherein said feedback circuit for feeding back the control signal to said sensor includes at least a superconducting coil.

35. The Josephson signal detector according to claim 34, wherein said feedback circuit is a circuit constructed to feed back the control signal to said sensor by current flowing through said superconducting coil constructing said feedback circuit.

36. The Josephson signal detector according to claim 5, wherein said readout circuit includes a flip-flop Josephson circuit using a Josephson quantum interference device and driven by a DC current source.

37. The Josephson signal detector according to claim 36, wherein said flip-flop Josephson circuit includes a circuit made by connecting a series-connected structure of at least two Josephson quantum interference devices and a series-connected structure of two load resistors in parallel, and by connecting intermediate contacts of said two series-connected structures by an inductance, and is a circuit which is operated by bringing one of said Josephson quantum interference devices into a voltage state and the other into a superconducting state in response to a signal input to said Josephson quantum interference devices of the flip-flop Josephson circuit.

38. The Josephson signal detector according to claim 36, wherein said flip-flop Josephson circuit includes a circuit made by connecting two Josephson quantum interference devices in series to form a series-connected structure and by connecting said series-connected structure with a constant voltage source, and which is a circuit operated by bringing one of said Josephson quantum interference devices into a voltage state and the other into a superconducting state in response a signal input to said Josephson quantum interference devices of the flip-flop Josephson circuit.

39. The Josephson signal detector according to claim 36, wherein said flip-flop Josephson circuit includes a circuit equipped with two current paths by connecting two series-connected structures, each of a Josephson quantum interference device and an inductance in parallel, and which is a circuit operated by switching current to either of said two current paths in response to a signal input to said Josephson quantum interference devices of the flip-flop Josephson circuit.

40. The Josephson signal detector according to claim 1, wherein said comparator has a capacitance, said capacitance being sufficient such that a Josephson oscillation generated by the Josephson junction of the sensor at an operating time of the sensor has a higher frequency than that corresponding to a turn-on delay of the Josephson junction of said comparator.

41. The Josephson signal detector according to claim 40, wherein the comparator further includes a capacitor portion connected in parallel with the Josephson junction of the comparator, the capacitor portion having at least one capacitor, the Josephson junction of the comparator and the capacitor portion providing said capacitance.

42. A measurement system containing a plurality of Josephson signal detectors according to claim 1, with each sensor connected to a respective comparator.

43. The measurement system according to claim 42, wherein each of the comparators is connected to a multiplexer so as to convert an output signal from each of the comparators to a serial signal; and wherein the multiplexer is connected to a demultiplexer so as to return the serial signal to a parallel signal.

44. The measurement system according to claim 42, further comprising a feedback circuit for feeding back a control signal to said sensors in response to an output of the readout circuit or the output of said comparator.

45. The measurement system according to claim 44, wherein a portion of said feedback circuit, apart from a superconducting loop and a superconducting coil thereof, is shared between at least said plurality of Josephson signal detectors.

46. The measurement system according to claim 44, further comprising a memory circuit for storing magnitudes of signals outputted from respective comparators, said magnitudes of signals stored in the memory circuit being fed back on a basis of their magnitude to respective sensors via said feedback circuit.

47. The measurement system according to claim 44, wherein said feedback circuit is constructed of at least a DC-powered flip-flop Josephson circuit having a Josephson quantum interference device.

48. The measurement system according to claim 47, wherein said Josephson circuit includes a circuit made by connecting a series-connected structure of at least two Josephson quantum interference devices and a series-connected structure of two load resistors in parallel, and by connecting intermediate contacts of said two series-connected structures by an inductance, and which is a circuit operated by bringing one of said Josephson quantum interference devices into a voltage state and the other into a superconducting state in response to a signal input to said Josephson quantum interference devices of the Josephson circuit.

49. The measurement system according to claim 47, wherein said Josephson circuit includes a circuit made by connecting two Josephson quantum interference devices in series to form a series-connected structure and by connecting said series-connected structure with a constant voltage source, and which is a circuit operated by bringing one of said Josephson quantum interference devices into a voltage state and the other into a superconducting state in response to a signal input to said Josephson quantum interference devices of the Josephson circuit.

50. The measurement system according to claim 47, wherein said Josephson circuit includes a circuit equipped with two current paths by connecting two series-connected structures, each of a Josephson quantum interference device and an inductance, in parallel, and which is a circuit operated by switching the current to either of said two current paths in response to a signal input to said Josephson quantum interference devices of the Josephson circuit.

51. The measurement system according to claim 44, further comprising a circuit to transform the output signal of the readout circuit of each of said Josephson signal detectors into serial data, wherein said serial data are converted into parallel data when a control signal is fed back to said sensor through said feedback circuit.

52. The measurement system according to claim 51, wherein said circuit to transform the output signal of said readout circuit into said serial data is a multiplexer which is constructed of a flip-flop circuit using a Josephson quantum interference device and powered by a DC current source.

53. The measurement system according to claim 48, further comprising a multiplexer, to convert signals from the comparators to serial data, and wherein said multiplexer is a flip-flop circuit, which includes a circuit made by connecting a series-connected structure of at least two Josephson quantum interference devices and a series-connected structure of two load resistors in parallel, and by connecting intermediate contacts of said two series-connected structures by an inductance, and which is a circuit operated by bringing one of said Josephson quantum interference devices into a voltage state and the other into a superconducting state in response to a signal input to said Josephson quantum interference devices of the Josephson circuit.

54. The measurement system according to claim 52, wherein said Josephson circuit is a flip-flop circuit, which includes a circuit made by connecting two Josephson quantum interference devices in series to form a series-connected structure and by connecting said series-connected structure with a constant voltage source, and which is a circuit operated by bringing one of said Josephson quantum interference devices into a voltage state and the other into a superconducting state in response to a signal input to said Josephson quantum interference devices of the Josephson circuit.

55. The measurement system according to claim 52, wherein said Josephson circuit is a flip-flop circuit, which includes a circuit equipped with two current paths by connecting two series-connected structures, each of a Josephson quantum interference device and an inductance, in parallel, and which is a circuit operated by switching current to either of said two current paths in response to a signal input to said Josephson quantum interference devices of the Josephson circuit.

56. The measurement system according to claim 42, wherein ground planes of each sensor and comparator are arranged as separate superconducting elements having no superconductive connection such that they correspond one to one.

57. The measurement system according to claim 42, further comprising a multiplexer, and wherein said SQUID, said comparator and said multiplexer are disposed in a cryogenic chamber so that data outputted from individual Josephson signal detectors may be converted into serial data by said multiplexer and outputted to a circuit at the room temperature.

58. The Josephson signal detector according to claim 1, further comprising:
a feedback circuit for feeding back a control signal to said sensor in response to the output of said comparator.

59. A measurement system comprising: a superconducting quantum interference device (SQUID) including two Josephson junctions and a superconducting ring arranged to connect said two Josephson junctions; a comparator including Josephson junctions for recognizing a magnitude of output voltage or output current of said SQUID; and a readout circuit including Josephson junctions for reading out an output of said comparator, said SQUID, said comparator and said readout circuit being powered substantially only by DC current sources.

60. A method of operating a Josephson signal detector, the detector including (1) a sensor having at least one Josephson junction, (2) a comparator including at least one Josephson junction, for recognizing a magnitude of output voltage or output current of the sensor, so as to provide an output of the comparator, and (3) a readout circuit including a Josephson junction, for reading out the output of the comparator, the method comprising the steps of:
powering said sensor and said comparator substantially only by a DC current source; and
inputting a signal to said sensor.

61. The method according to claim 60, wherein both the readout circuit and the sensor are powered by DC current sources.

62. The method according to claim 60, wherein the comparator is operated by injecting the output current of the sensor into the comparator.

63. The method according to claim 60, wherein the output current of the sensor is inputted into superconducting wiring, a Josephson junction or a Josephson quantum interference device, of the comparator.

64. A Josephson signal detector, comprising:
a sensor including at least one Josephson junction biased by DC current and first inductors for outputting a signal thereof;
a comparator including a plurality of first Josephson quantum interference devices for receiving the signal from said sensor and second inductors for outputting a signal thereof, each of said first Josephson quantum interference devices including at least two Josephson junctions disposed in parallel on a superconducting loop, and being biased by DC current and magnetically coupled with one of said first inductors; and
a readout circuit including a plurality of second Josephson quantum interference devices for receiving the signal from said comparator, each of said second Josephson quantum interference devices including at least two Josephson junctions disposed in parallel on a superconducting loop, and being biased by DC current and magnetically coupled with one of said second inductors;

wherein at least one of said first Josephson quantum interference devices is coupled with one of said first inductors having an opposite signal direction in regard to a DC-biased direction thereof, to that of others of the first inductors, and at least one of said second Josephson quantum interference devices is coupled with one of said second inductors having a same signal direction in regard to DC-biased direction thereof as that of others of the second inductors.

65. A measurement system, comprising:

a superconducting quantum interference device (SQUID) including two Josephson junctions, a superconducting ring arranged to connect said two Josephson junctions and a first inductor for outputting a signal from the SQUID;

a comparator including Josephson junctions and an inductance magnetically coupled with said first inductor as sole means for receiving the signal from said SQUID, and a second inductor for outputting a signal from the comparator; and a readout circuit including Josephson junctions and an inductance magnetically coupled with said second inductor as sole means for receiving the signal from said comparator, said SQUID, said comparator and said readout circuit being powered substantially only by DC current sources.

* * * * *